United States Patent
Noguchi et al.

(10) Patent No.: US 11,905,621 B2
(45) Date of Patent: Feb. 20, 2024

(54) SIC SINGLE CRYSTAL, METHOD OF MANUFACTURING SIC INGOT, AND METHOD OF MANUFACTURING SIC WAFER

(71) Applicants: Resonac Corporation, Tokyo (JP); DENSO CORPORATION, Kariya (JP)

(72) Inventors: Shunsuke Noguchi, Kusatsu (JP); Yohei Fujikawa, Hikone (JP); Hidetaka Takaba, Obu (JP)

(73) Assignees: Resonac Corporation, Tokyo (JP); DENSO CORPORATION, Kariya (JP)

( * ) Notice: Subject to any disclaimer, the term of this patent is extended or adjusted under 35 U.S.C. 154(b) by 361 days.

(21) Appl. No.: 17/267,847

(22) PCT Filed: Aug. 13, 2019

(86) PCT No.: PCT/JP2019/031830
§ 371 (c)(1),
(2) Date: Feb. 11, 2021

(87) PCT Pub. No.: WO2020/036174
PCT Pub. Date: Feb. 20, 2020

(65) Prior Publication Data
US 2021/0246572 A1    Aug. 12, 2021

(30) Foreign Application Priority Data
Aug. 13, 2018 (JP) ................. 2018-152474

(51) Int. Cl.
*B32B 3/00* (2006.01)
*C30B 29/36* (2006.01)
*C30B 23/02* (2006.01)

(52) U.S. Cl.
CPC ............. *C30B 29/36* (2013.01); *C30B 23/02* (2013.01)

(58) Field of Classification Search
CPC ................... C30B 29/36; C30B 23/02
See application file for complete search history.

(56) References Cited

U.S. PATENT DOCUMENTS

| 6,228,164 B1 | 5/2001 | Ammon et al. |
| 2011/0006309 A1 | 1/2011 | Momose et al. |
| 2021/0189596 A1 | 6/2021 | Noguchi et al. |

FOREIGN PATENT DOCUMENTS

| JP | 61-144017 A | 7/1986 |
| JP | 2011-016721 A | 1/2011 |
| JP | 2011-111372 A | 6/2011 |
| JP | 2011-219296 A | 11/2011 |
| JP | 2011-222750 A | 11/2011 |

(Continued)

OTHER PUBLICATIONS

Adrian Powell et al., "Bulk Growth of Large Area SiC Crystals", Materials Science Forum, 2015, vol. 858, pp. 5-10 (6 pages total).

(Continued)

*Primary Examiner* — Elizabeth E Mulvaney
(74) *Attorney, Agent, or Firm* — Sughrue Mion, PLLC

(57) ABSTRACT

A SiC single crystal, wherein difference between the curving amount of the atomic arrangement surface on the cut surface cut along the <1-100> direction through the center in plan view and the curving amount of the atomic arrangement surface on the cut surface cut along the <11-20> direction that passes through the center of view and is perpendicular to the <1-100> direction is 60 μm or less.

8 Claims, 16 Drawing Sheets

(56) References Cited

FOREIGN PATENT DOCUMENTS

| | | |
|---|---|---|
| JP | 2013-136494 A | 7/2013 |
| JP | 2015-135902 A | 7/2015 |
| TW | 200632153 A | 9/2006 |
| WO | 2009/035095 A1 | 3/2009 |

OTHER PUBLICATIONS

Yingxin Cui et al., "Spatial variation of lattice plane bending of 4H-SiC substrates", CrystEngComm, 2017, vol. 19, pp. 3844-3849 (6 pages total).

H. Kondo et al., "Development of RAF Quality 150mm 4H-Sic Wafer", Materials Science Forum, 2014, vols. 778-780, pp. 17-21 (5 pages total).

International Search Report for PCT/JP2019/031830 dated Oct. 1, 2019 [PCT/ISA/210].

Office Action dated Jan. 21, 2022, issued by the China National Intellectual Property Administration in application No. 201980054072.5.

International Search Report for PCT/2019/031814, dated Oct. 1, 2019.

Office Action dated Feb. 15, 2022 in Chinese Application 201980053250.2.

Office Action dated Aug. 10, 2023 in related U.S. Appl. No. 17/267,691.

SIC SINGLE CRYSTAL, METHOD OF MANUFACTURING SIC INGOT, AND METHOD OF MANUFACTURING SIC WAFER

CROSS REFERENCE TO RELATED APPLICATIONS

This application is a National Stage of International Application No. PCT/JP2019/031830 filed Aug. 13, 2019, claiming priority based on Japanese Patent Application No. 2018-152474 filed Aug. 13, 2018, the content of which is incorporated herein by reference.

BACKGROUND OF THE INVENTION

Field of the Invention

The present invention relates to a SiC single crystal, a method of manufacturing a SiC ingot and a method of manufacturing a SiC wafer.

Background Art

Silicon carbide (SiC) has a dielectric breakdown electric field one order of magnitude larger, and a band gap three times larger than silicon (Si). Additionally, silicon carbide (SiC) has characteristics such as a thermal conductivity approximately three times higher than that of silicon (Si). It is expected that the silicon carbide will be applied to power devices, high-frequency devices, high-temperature operating devices, and the like.

For devices such as semiconductor devices, a SiC epitaxial wafer having an epitaxial film formed on the SiC wafer is used. An epitaxial film provided on a SiC wafer by a chemical vapor deposition (CVD) method serves as an active region for a SiC semiconductor device.

Therefore, there is a demand for high-quality SiC wafers that are not damaged such as cracks and have few defects. In the present specification, the SiC epitaxial wafer means a wafer after forming an epitaxial film on a SiC single crystal. In the present specification, the SiC wafer means a wafer before forming an epitaxial film on a SiC single crystal.

For example, Patent Literature 1 describes that the epitaxial film formed on the SiC wafer is improved by keeping a warpage amount of the wafer and a deviation amount of the crystal orientation within a predetermined range.

Patent Literature 2 describes that a high-quality epitaxial thin film can be obtained by keeping a deviation of the growth plane orientation in the wafer plane within a predetermined range.

CITATION LIST

Patent Literatures

[Patent Literature 1]
Japanese Unexamined Patent Application, First Publication No. 2011-219296
[Patent Literature 2]
Japanese Unexamined Patent Application, First Publication No. 2011-16721

SUMMARY OF THE INVENTION

Problems to be Solved by the Invention

However, as described in Patent Literature 1 and Patent Literature 2, the occurrence of basal plane dislocation (BPD) may not be sufficiently suppressed only by controlling the degree of lattice deviation in a predetermined direction. The basal plane dislocation (BPD) is one of the killer defects of the SiC wafer, and the slip generated on the basal plane is considered to be one of the causes.

The present invention has been made in view of the above problems, and an object of the present invention is to provide a SiC single crystal capable of suppressing the occurrence of basal plane dislocations (BPD).

Means to Solve Problems

As a result of diligent studies, the present inventors have found that when crystal growth is performed using a SiC single crystal having a small relative value of the curving amount of the atomic arrangement surface (lattice plane) in multiple cut surfaces instead of an absolute value of the curving amount of the atomic arrangement surface (lattice plane) on the cut plane cut along a specific direction, the occurrence of basal plane dislocation (BPD) is suppressed in the crystal growth portion.

The present invention provides the following means for solving the above problems.

(1) A SiC single crystal according to a first aspect is a SiC single crystal, wherein the difference between the curving amount of the atomic arrangement surface on the cut surface cut along the <1-100> direction through the center in plan view and the curving amount of the atomic arrangement surface on the cut surface cut along the <11-20> direction that passes through the center of view and is perpendicular to the <1-100> direction is 60 μm or less.

(2) In the SiC single crystal according to the aspect, the difference between the maximum value and the minimum value of the curing amount of the atomic arrangement surface on each of the cut surfaces cut along the six sides rotated by 30° with respect to the [1-100] direction through the center in plan view may be 60 jam or less.

(3) In the SiC single crystal according to the aspect, the atomic arrangement surfaces may be curved in the same direction at any cut surface.

(4) In the SiC single crystal according to the aspect, the difference between the maximum value and the minimum value of the curving amount per unit length on the atomic arrangement surface may be 4 μm/cm or less.

(5) In the SiC single crystal according to the aspect, the diameter of the SiC single crystal in plan view may be 140 mm or more.

(6) In the SiC single crystal according to the aspect, the thickness of the SiC single crystal may be 500 jam or more.

(7) In a method of manufacturing a SiC ingot according to a second aspect, the SiC single crystal according to the above aspect is used as a seed crystal, and a SiC single crystal is formed on the seed crystal.

(8) In a method of manufacturing a SiC wafer according to a third aspect, a SiC ingot produced by the method for producing the SiC ingot according to the above aspect, is sliced.

Advantageous Effects of Invention

When crystal growth is carried out using the SiC single crystal according to the above aspect, the occurrence of basal plane dislocations (BPD) can be suppressed in the crystal growth portion.

PREFERRED EMBODIMENTS

Hereinafter, preferred examples of this embodiment will be described in detail with reference to the drawings as appropriate. The drawings used in the following description may be shown by enlarging the characteristic parts for convenience, and the dimensions and ratios of the respective components may differ from the actual ones. The materials, dimensions, numbers, numerical values, quantities, ratios, positions, characteristics, etc. exemplified in the following description are examples. The present invention is not limited thereto, and can be appropriately modified and implemented without changing the gist thereof. In addition, the following examples describe specifically preferable examples in order to better understand the gist of the invention, and do not limit the present invention unless otherwise specified. The length, position, shape, number, quantity, material, etc. can be omitted, added, replaced, or otherwise changed without departing from the spirit of the present invention.

(SiC Single Crystal)

Figure 1:
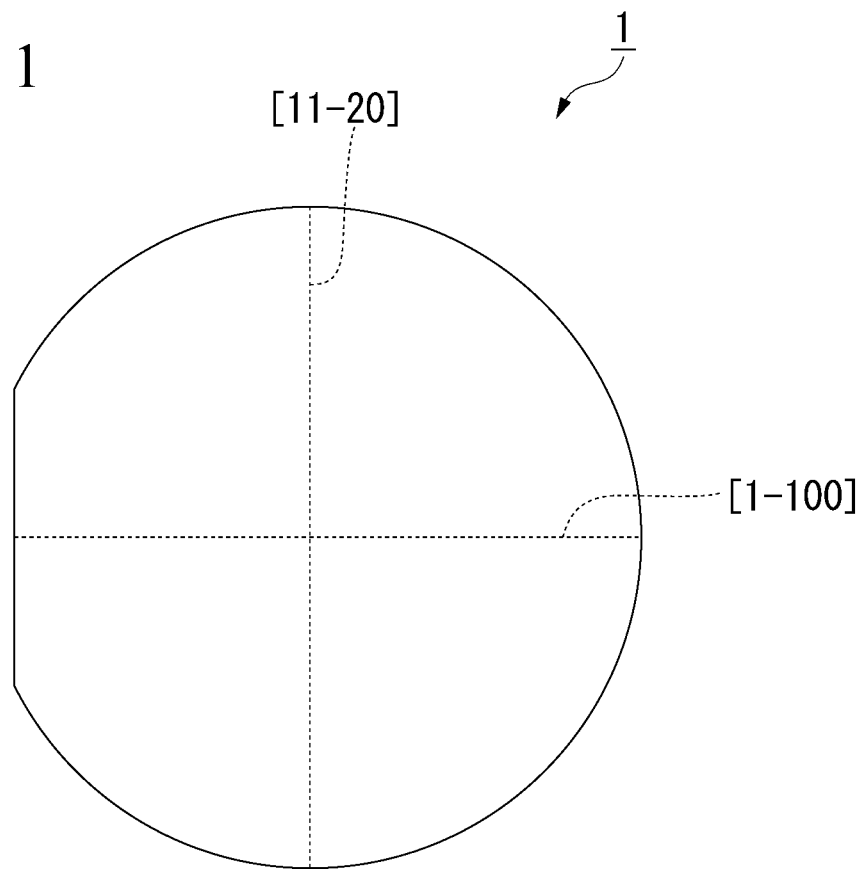
FIG. 1 is a figure of an example of the SiC single crystal which concerns on this embodiment in plan view.
Figure 2:
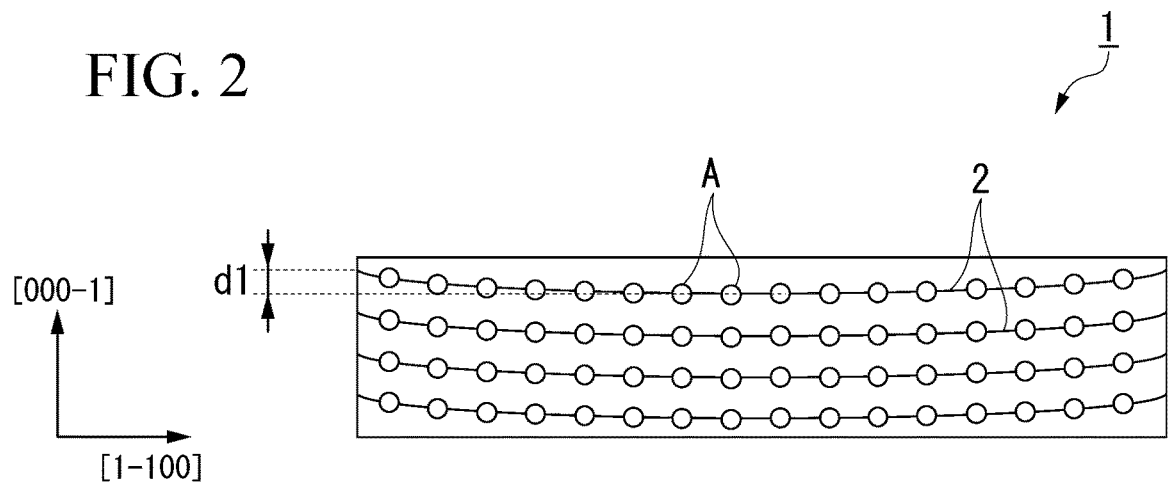
FIG. 2 is a schematic cross-sectional view of an example of a cut surface obtained by cutting a SiC single crystal according to this embodiment through the center in plan view and along the [1-100] direction.
Figure 3:
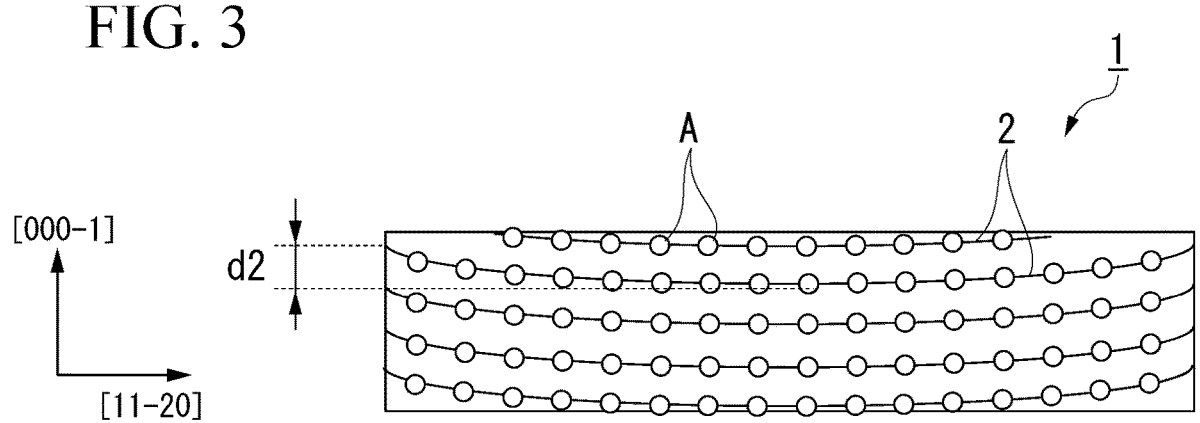
FIG. 3 is a schematic cross-sectional view of an example of a cut surface obtained by cutting a SiC single crystal according to this embodiment through the center in plan view and along the [11-20] direction.

FIG. 1 is a plan view of an example of a SiC single crystal according to the present embodiment. Further, FIG. 2 is a schematic cross-sectional view of a cut surface obtained by cutting the SiC single crystal according to the present embodiment through the center in plan view and along the [1-100] direction. In FIG. 2, the upper side is the [000-1] direction, that is, the direction in which the carbon surface (C surface, (000-1) surface) appears when the cutting is performed perpendicularly to the <0001> direction. Further, FIG. 3 is a schematic cross-sectional view of a cut surface obtained by cutting the SiC single crystal according to the present embodiment through the center in plan view and along the [11-20] direction orthogonal to [1-100] shown in FIG. 2. Also in FIG. 3, the upper side is the [000-1] direction, that is, the direction in which the carbon surface (C surface, (000-1) surface) appears when the cutting is performed perpendicularly to the <0001> direction. In FIGS. 2 and 3, the [1-100] direction and the [11-20] direction are selected as representative directions of the <1-100> direction and the <11-20> direction orthogonal to the <1-100>. Further, in the following description, the [1-100] direction and the [11-20] direction will be used. FIGS. 2 and 3 both show a part of a SiC single crystal.

In the present specification, "the center in plan view" means the center of the circle when the SiC single crystal to be evaluated is circular in plan view, or is partially missing, but becomes circular when the missing part is virtually supplemented (for example, in the case of a SiC wafer having an orientation flat). However, it is not limited to this case. For example, when the SiC single crystal ingot is crystal-grown by a known method (for example, sublimation method), since the cross section perpendicular to the crystal growth direction is circular, a wafer or a cut body cut in the cross section perpendicular to the crystal growth direction is circular in plan view. Therefore, in this case as well, "the center in plan view" means the center of the circle. On the other hand, in the case of a wafer or a cut body obtained by cutting a SiC single crystal ingot in a direction intersecting the crystal growth direction (excluding the vertical direction), the wafer is oval in plan view. Therefore, in this case, "the center in plan view" means the intersection of the major axis and the minor axis of the ellipse.

The crystal orientation and atomic arrangement surface (lattice plane, crystal lattice plane) are expressed using the following parentheses as the Miller index. ( ) and { } are used to represent faces (also called face indices). ( ) is used to represent a specific plane, and { } is used to represent a generic term of equivalent planes due to crystal symmetry (aggregate plane). On the other hand, < > and [ ] are used to indicate the direction (particularly also called the direction index). [ ] is used to express a specific direction, and < > is used to express an equivalent direction due to crystal symmetry. The direction index expressed by the same index as the face index indicates the direction of the normal of the face.

The SiC single crystal 1 is a single crystal in which a plurality of atoms A are aligned. Therefore, as shown in FIGS. 2 and 3, when the cut surface of the SiC single crystal is viewed microscopically, an atomic arrangement surface 2 in which a plurality of atoms A are arranged is formed. In the drawing, the atomic arrangement surface 2 on the cutting surface can be drawn as a line extending in a direction substantially parallel to the cutting direction obtained by connecting the atoms A arranged along the cutting surface.

The shape of the atomic arrangement surface 2 on the cut surface may be a convex shape or a concave shape regardless of the shape of the outermost surface of the SiC single crystal 1. The difference between the atomic position of the SiC single crystal 1 on the center in plan view and the atomic position at the end of the SiC single crystal 1 along the [000-1] direction is defined as the curving amount. Therefore, when the shape of the atomic arrangement surface 2 is a concave shape recessed toward the center in plan view, the curving amount takes a positive value. On the other hand, when the shape of the atomic arrangement surface 2 is a convex shape protruding toward the center in plan view, the curving amount takes a negative value. The curving amount often differs depending on the cut surface (measurement direction) as shown in FIGS. 2 and 3.

The shape of the atomic arrangement surface 2 is measured by X-ray diffraction (XRD). In other words, the shape of the atomic arrangement surface 2 can be determined based on X-ray diffraction (XRD). The surface to be measured is determined according to the direction of measurement. Assuming that the measurement direction is [hkil], the measurement surface must satisfy the relationship of (mh mk mi n). Here, m is an integer of 0 or more, and n is a natural number. For example, when measuring in the [11-20] direction, the (0004) plane is selected with m=0 and n=4, the (22-416) plane and the like are selected with m=2 and n=16.

On the other hand, when measuring in the [1-100] direction, the (0004) plane is selected with m=0 and n=4, the (3-3016) plane and the like are selected with m=3 and n=16. That is, the measurement plane may be a different plane depending on the measurement direction, and the atomic arrangement surface may not necessarily be the same plane. By satisfying the above relationship, it is possible to prevent the lattice curving in the a-plane or m-plane direction, which has a small effect on crystal growth, from being mistaken for the lattice curving in the c-plane direction, which has a large effect on crystal growth. Further, the measurement may be performed on either the C surface or the Si surface, but the measurement direction is not changed in one sample.

The X-ray diffraction data is acquired at, for example, a total of five points along a predetermined direction, that is, one point at the center, two points at the ends, and two points at the midpoint between the center and the ends. When the atomic arrangement surface 2 is curved, the X-ray diffraction direction changes, so that the position of the peak w angle of the output X-ray diffraction image fluctuates between the center and other portions. Further, the radius of curvature of the atomic arrangement surface 2 can be obtained from the position variation of the diffraction peak, and the curving amount of the atomic arrangement surface 2 can also be obtained.

The number and position of acquiring X-ray diffraction data is not limited to the above example. For example, X-ray diffraction data may be acquired at nine points on the same straight line passing through the center of the wafer W. In addition to the above five points, the location for acquiring X-ray diffraction data can be arbitrarily selected. For example, it is preferable to acquire X-ray diffraction data at each midpoint of "center, ends, midpoint between center and ends" along a predetermined direction.

(Specific Explanation of a Method for Measuring the Curving Amount of the Atomic Arrangement Surface (Method 1))

Based on the measured value of XRD of the outer peripheral end portion of a disk-shaped sample (hereinafter referred to as wafer W) obtained by slicing a cylindrical SiC single crystal (ingot) that is circular in plan view perpendicular to the crystal direction, a method for measuring the magnitude of curving of the atomic arrangement surface will be specifically described.

Figure 4:
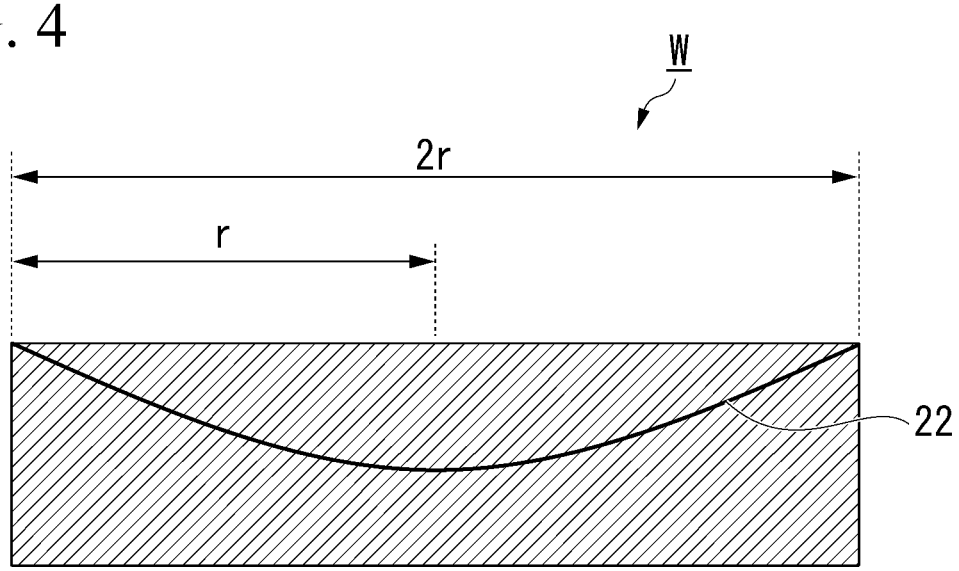
FIG. 4 is a figure for demonstrating concretely an example of the method of measuring the curving amount of the atomic arrangement surface.

FIG. 4 is a schematic cross-sectional view of the wafer W. FIG. 4 schematically shows a cut surface cut along the measurement direction of the atomic arrangement surface, for example, the [1-100] direction, passing through the center in plan view. Assuming that the radius of the wafer W is r, the lateral length of the cross section is 2r.

FIG. 4 also shows the shape of the atomic arrangement surface 22 on the wafer W. As shown in FIG. 4, the shape of the wafer W itself is flat, but the atomic arrangement surface 22 may be curved. The atomic arrangement surface 22 shown in FIG. 4 is symmetrical and is curved in a concave shape. This symmetry is due to the fact that the ingot manufacturing conditions are usually symmetric with respect to the central axis (the axis that passes through the center of the circle in plan view and extends in the crystal growth direction). It should be noted that this symmetry does not have to be perfect symmetry, and means symmetry as an approximation that allows blurring due to fluctuations in manufacturing conditions and the like.

Figure 5:
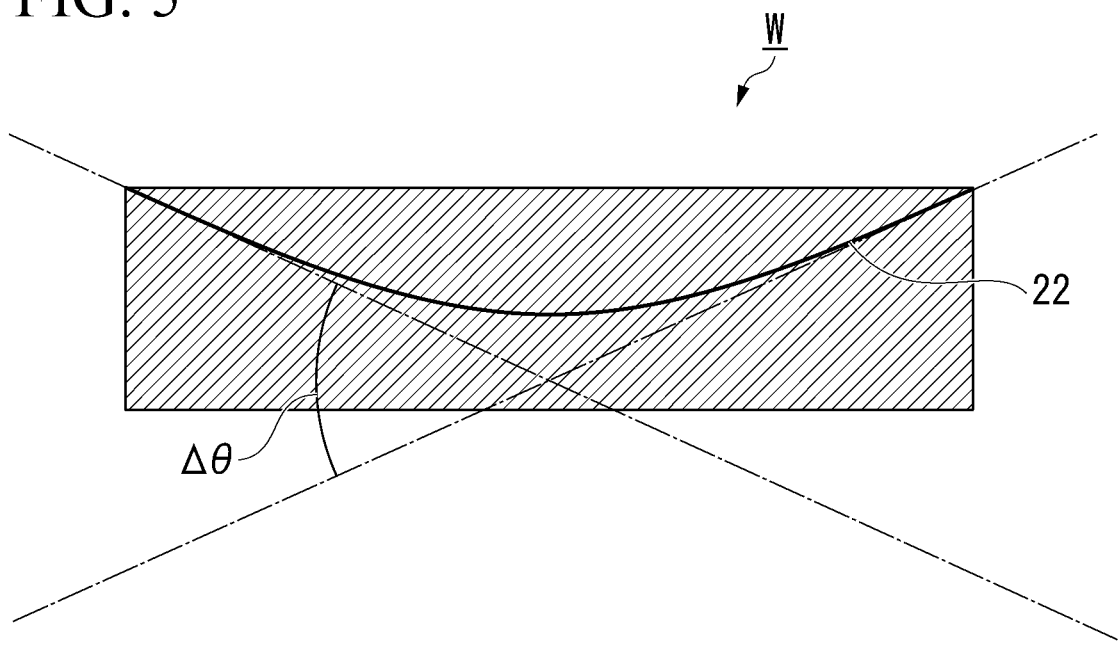
FIG. 5 is a figure for demonstrating concretely an example of the method of measuring the curving amount of the atomic arrangement surface.

Next, XRD is performed on both outer peripheral ends of the wafer W, and the difference $\Delta\theta$ of the measured X-ray diffraction peak angles between the two points is obtained. That is, the difference $\Delta\theta$ of the X-ray diffraction peak angles at both outer peripheral ends of the wafer W is obtained. As shown in FIG. 5, the Δθ is the difference between the slopes (that is, the slopes of the tangents) of the two atomic arrangement surfaces 22 measured. As the diffraction plane used for the X-ray diffraction measurement, an appropriate plane is selected according to the cut surface as described above.

Figure 6:
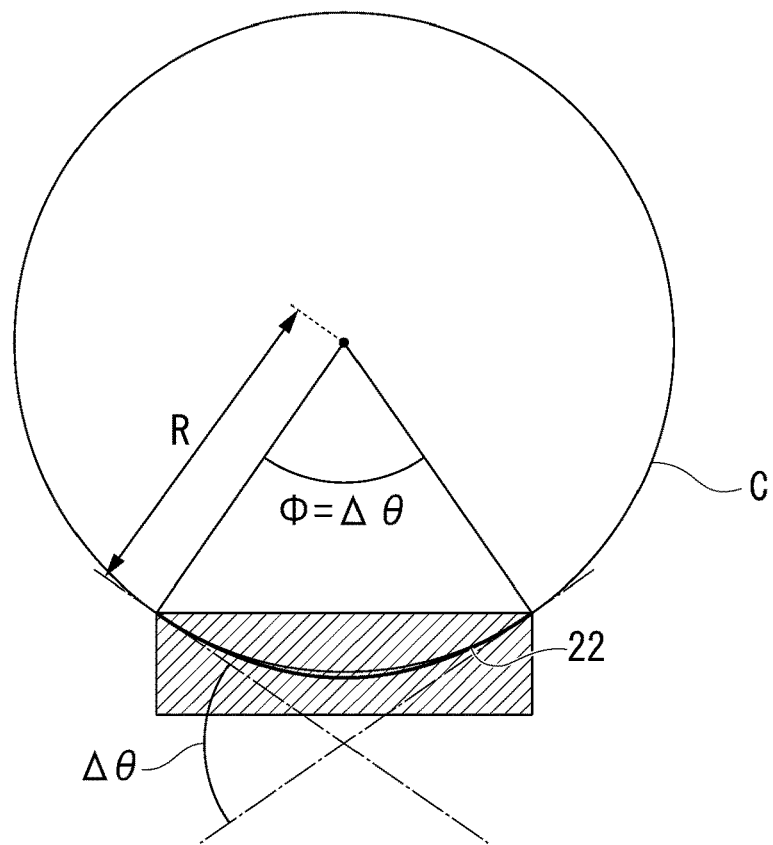
FIG. 6 is a figure for demonstrating concretely an example of the method of measuring the curving amount of the atomic arrangement surface.

Next, with reference to FIG. 6, a method of obtaining the radius of curvature of the curved atomic arrangement surface 22 from the obtained Δθ will be described. FIG. 6 shows a circle C in contact with two measured atomic arrangement surfaces, assuming that the curved surface of the atomic arrangement surface 22 of the wafer W is a part of a circle. Geometrically, it can be seen from FIG. 6 that the central angle φ of the sector including the arcs having the contacts at both ends is equal to the difference Δθ of the measured X-ray diffraction peak angles. The radius of curvature of the atomic arrangement surface 22 corresponds to the radius R of the arc. The radius R of the arc is calculated by the following relational expression.

$$R = \frac{r}{\sin\frac{\Delta\theta}{2}} \qquad \text{[Formula 1]}$$

Figure 7:
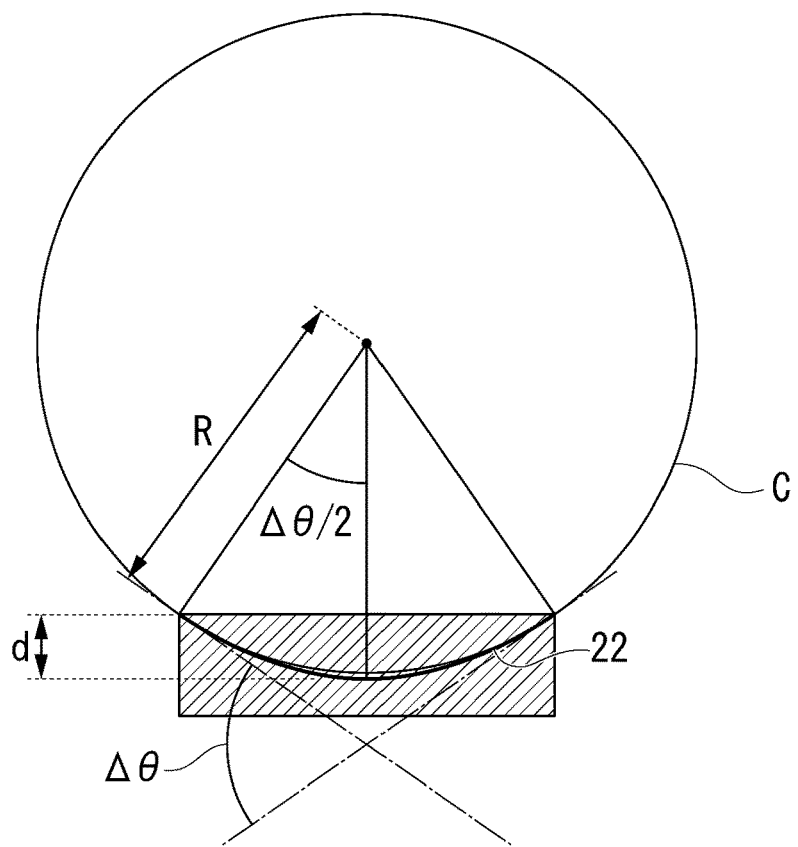
FIG. 7 is a figure for demonstrating concretely an example of the method of measuring the curving amount of the atomic arrangement surface.

Then, the curving amount d of the atomic arrangement surface 22 is obtained from the radius R of the arc and the radius r of the wafer W. As shown in FIG. 7, the curving amount d of the atomic arrangement surface 22 corresponds to the radius R of the arc minus the distance of the perpendicular line drawn from the center of the arc to the surface of the wafer W. The distance of the perpendicular line drawn from the center of the arc to the surface of the wafer W is calculated from the three-square theorem, and the following equation holds. In the present specification, the curving amount d when the radius of curvature is positive (concave surface) is defined as a positive value, and the curving amount d when the radius of curvature is negative (convex surface) is defined as a negative value.

$$d = |R| - \sqrt{|R^2 - r^2|} \qquad \text{[Formula 2]}$$

As described above, R can be measured only from the measured values of XRD at both outer ends of the wafer W. On the other hand, in this case, if there is local distortion or the like at the measurement location, it cannot be said that there is not a possibility that the shape may be misunderstood. Therefore, the X-ray diffraction peak angle is measured at a plurality of points, and the curvature per the unit length may be converted from the following equation. For example, in order to improve accuracy, it is preferable to measure the X-ray diffraction peak angle at 5 or more points including the center, the ends, and the midpoint between the center and the ends, and it is more preferable to measure at 9 or more points.

$$R = \frac{1}{\sin\left(\frac{1}{2} \cdot \frac{d\theta}{dr}\right)} \qquad \text{[Formula 3]}$$

Figure 8:
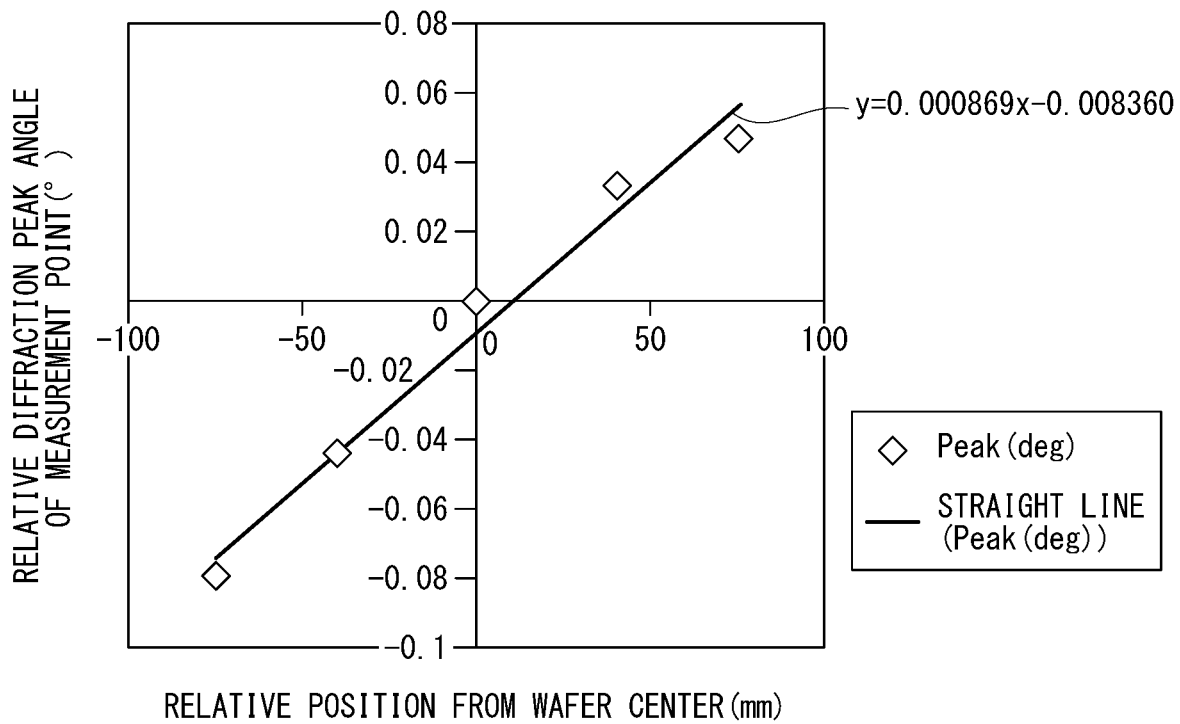
FIG. 8 is an example in which the radius of curvature of the atomic arrangement surface is obtained from a plurality of XRD measurement points.

FIG. 8 shows an example in which the radius of curvature of the atomic arrangement surface is obtained from a plurality of XRD measurement points. The horizontal axis of FIG. 8 shows the relative position from the wafer center, and the vertical axis shows the relative diffraction peak angle of each measurement point with respect to the wafer center diffraction peak angle. FIG. 8 is an example in which the [1-100] direction of the wafer is measured and the measurement plane is (3-3016). The measurement points were 5 points. The five points are arranged in a substantially straight line, and dθ/dr=8.69×10⁻⁴ deg/mm can be obtained from this inclination. By applying this result to the above equation, it can be calculated that the concave surface has R=66 m. Then, from this R and the radius r (75 mm) of the wafer, the curving amount d of the atomic arrangement surface can be obtained as 42.6 μm.

Up to this point, the example in which the shape of the atomic arrangement surface is concave has been described, but the same can be obtained for a convex surface. In the case of a convex surface, R is calculated as a minus.

(Explanation of Another Method for Measuring the Curving Amount of the Atomic Arrangement Surface (Method 2))

Figure 9:
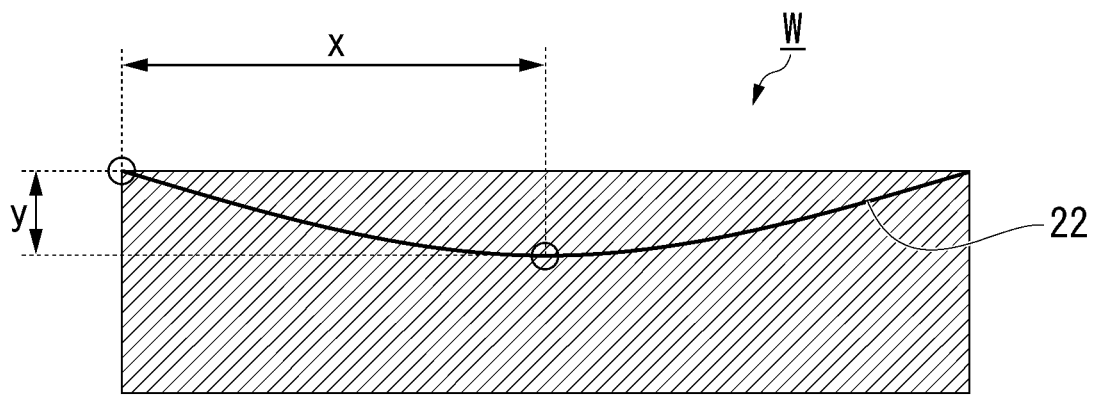
FIG. 9 is a figure for demonstrating concretely another example of the method of measuring the curving amount of an atomic arrangement surface.

The curving amount of the atomic arrangement surface may be determined by another method. FIG. 9 schematically shows a cut surface of the wafer W cut along the measurement direction of the atomic arrangement surface, for example, the [1-100] direction, passing through the center in plan view. In FIG. 9, a case where the shape of the atomic arrangement surface 22 is curved in a concave shape will be described as an example.

Figure 10A:
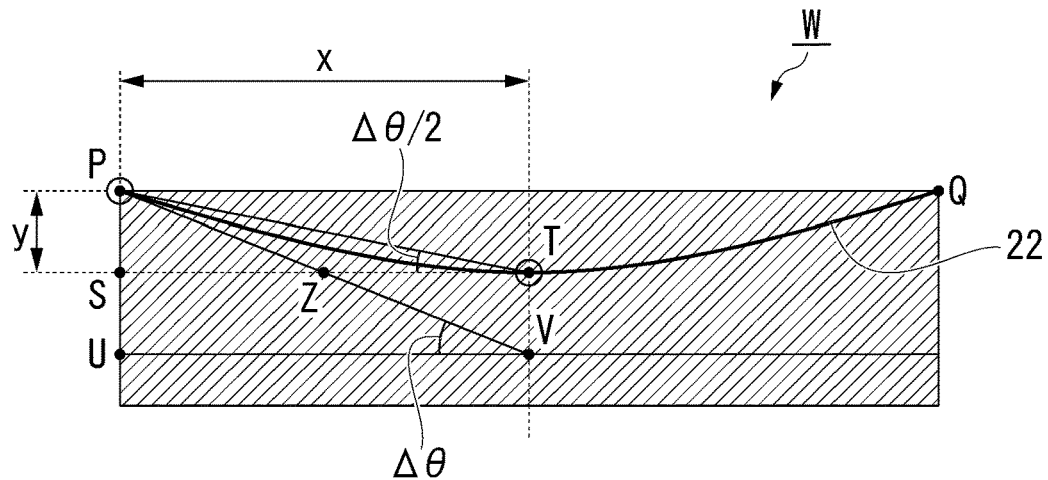
FIG. 10A is a figure for demonstrating concretely another example of the method of measuring the curving amount of an atomic arrangement surface.
Figure 10B:
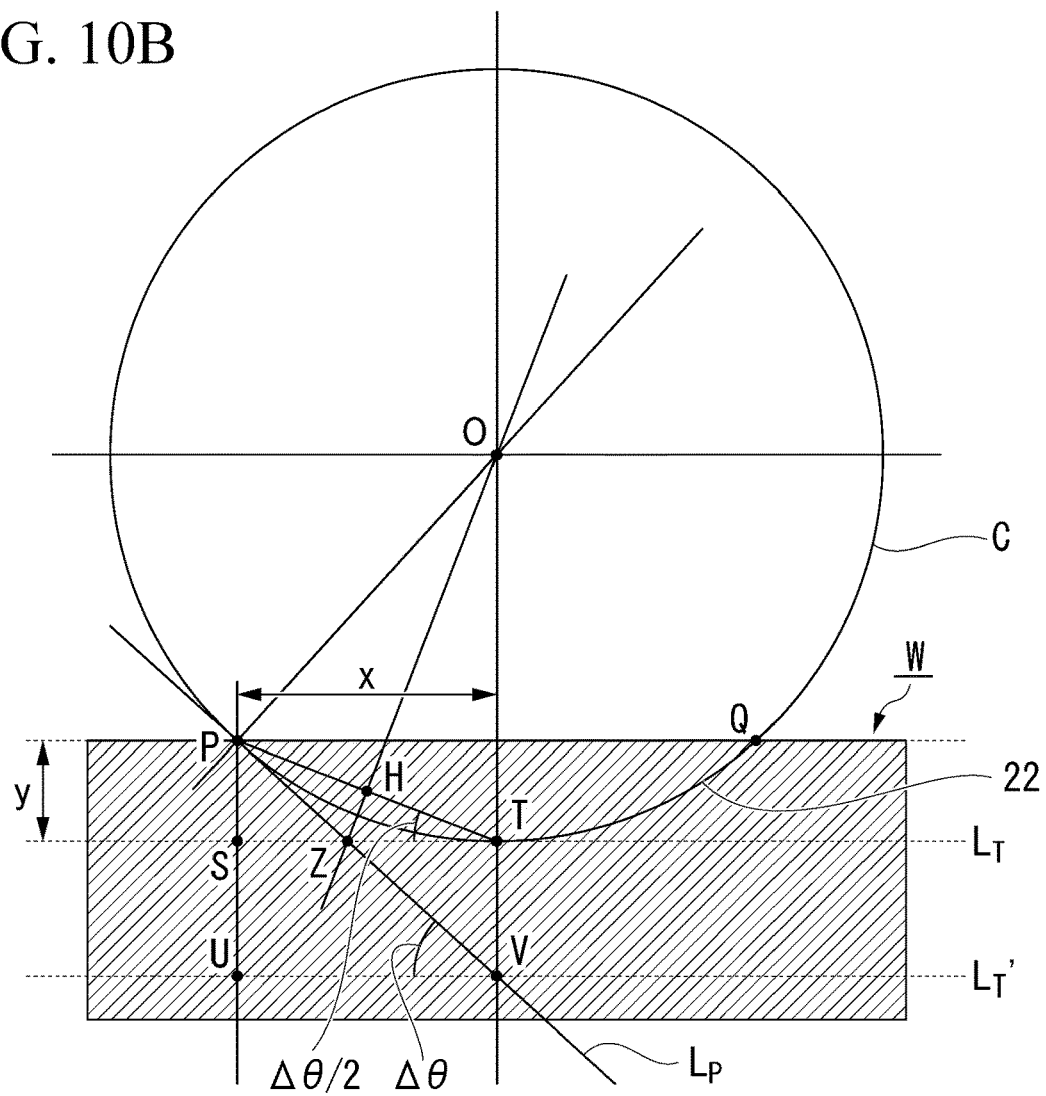
FIG. 10B is a supplementary figure for deriving $\Delta\theta/2$ in FIG. 10A

As shown in FIG. 9, the diffraction peaks of X-ray diffraction are measured at two locations (the two locations marked with a circle in FIG. 9) at a distance x from the center of the wafer W and at the center of the wafer W. From the symmetry of the manufacturing conditions of the ingot, the shape of the wafer W can be made symmetrical as an approximation, and it can be estimated that the atomic arrangement surface 22 becomes flat at the center of the wafer W in plan view. Therefore, as specifically shown in FIG. 10A, let Δθ be the difference in the inclination of the atomic arrangement surface 22 at a distance x from the center of the wafer W and the center of the wafer W, the difference in slope between the tangent line at the center of the wafer W and the straight line connecting the center of the wafer W and a place on the atomic arrangement surface 22 that is separated from the center of the wafer W by a distance x is (Δθ/2). Therefore, the relative position y of the atomic arrangement surface 22 at a place separated by a distance x with respect to the center of the wafer W can be expressed by the following equation. FIG. 10B shows a supplementary diagram for deriving Δθ/2 in FIG. 10A. Points P, Q, S, T, U, V and Z in FIGS. 10A and 10B indicate the same position. In FIG. 10B, the circle C is a circle tangent to the atomic arrangement surface, assuming that the curved surface of the atomic arrangement surface 22 is a part of the circle, as in FIG. 6. Let R be the radius of the circle C. The point O indicates the center of the circle C. The straight line $L_P$ is a tangent line of the point P, the straight line $L_T$ is a tangent line of the point T, and the straight line $L_T'$ is a straight line passing through the point V and parallel to the straight line $L_T$. The point H indicates the midpoint of the line segment PT. Let Z be the intersection of the straight line passing through the point O and the point H and the tangent line $L_T$. ΔPZH and ΔTZH are congruent because line segment PH=line segment TH, line segment ZH are common, and ∠PHZ=∠THZ=90°. Therefore, ∠HPZ=∠HTZ. In addition, ∠HPQ=∠HTZ due to the relationship of alternate angles. Since ∠PZS=Δθ and ∠PZS=∠QPZ=∠HPZ+∠HPQ=2∠HTZ due to alternate angles, ∠HTZ=Δθ/2 can be obtained. Since ∠HTZ=∠PTS and y/x=tan∠PTS, the following equation can be obtained.

$$y = x\tan\left(\frac{\Delta\theta}{2}\right) \qquad \text{[Formula 4]}$$

Figure 10C:
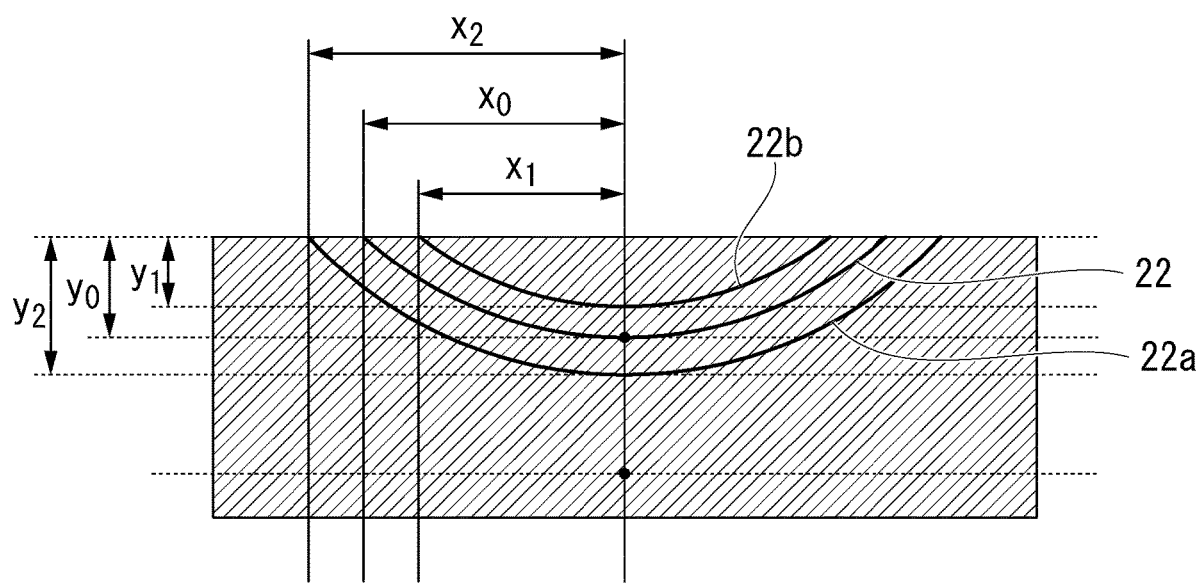
FIG. 10C is a figure for supplementing FIG. 10A.

As shown in FIG. 10C, by changing the position of the distance x from the center and measuring at a plurality of points ($x_0$, $x_1$, $x_2$), the relative atomic position of the atomic arrangement surface 22 at the wafer center and the measurement point can be obtained at each point. In this method, the relative positions of atoms on the atomic arrangement surface are obtained at each measurement point. Therefore, the curving amount ($y_0$, $y_1$, $y_2$) of the local atomic arrangement surface can be obtained. In addition, the relative atomic positions of the atomic arrangement surface 22 can be shown as a graph in the entire wafer W, and it is useful for sensuously grasping the arrangement of atomic arrangement surfaces 22, 22a, and 22b.

On the other hand, since the measurement at each point is based on the measured value at one place, some positions may be difficult to measure (especially near one end of the wafer), depending on the diffraction conditions, and further, if there is a portion having poor crystallinity, an error may be easily included. Therefore, with the current measurement technology, this method is preferably used when obtaining a reference value for sensuously grasping the arrangement of the atomic arrangement surfaces, rather than using it as a method for measuring the warp of the atomic arrangement surface 22.

In SiC single crystal 1 according to this embodiment, the difference between the curving amount d1 of the atomic arrangement surface 2 on the cut surface cut along the <1-100> direction through the center in plan view and the curving amount d2 of the atomic arrangement surface 2 on the cut surface cut along the <11-20> direction that passes through the center of view and is perpendicular to the <1-100> direction is 60 µm or less. The difference between the curving amount d1 and the curving amount d2 is preferably 40 µm or less, and more preferably 20 µm or less.

Figure 11A:
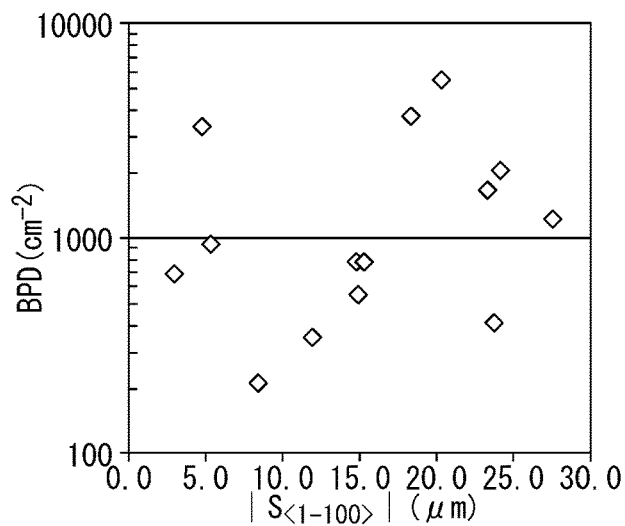
FIG. 11A is a figure which shows the relationship between the absolute value of the curving amount of the atomic arrangement plane in the cut plane in the [1-100] direction of a single crystal, and the BPD density contained in the crystal growth portion when a single crystal is grown on a predetermined SiC single crystal.
Figure 11B:
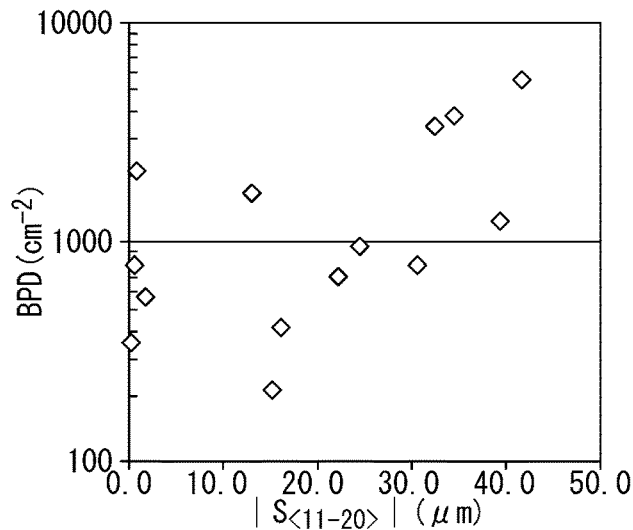
FIG. 11B is a figure which shows the relationship between the absolute value of the curving amount of the atomic arrangement plane in the cut plane in the [11-20] direction of a single crystal, and the BPD density contained in the crystal growth portion when a single crystal is grown on a predetermined SiC single crystal.
Figure 11C:
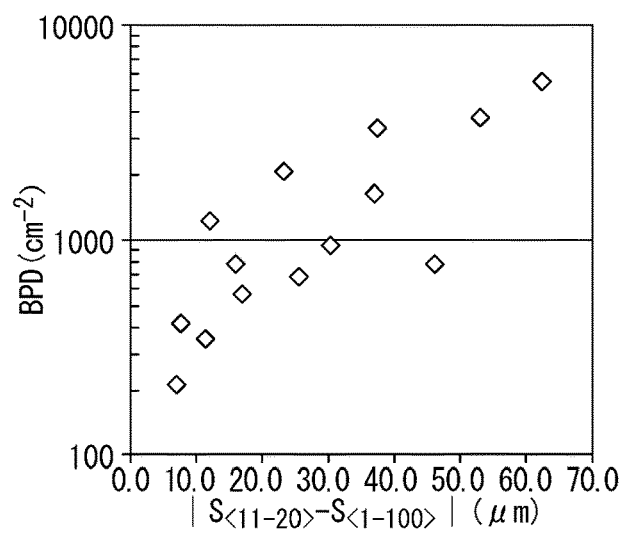
FIG. 11C is a figure which shows the relative value of the curving amount d1 in the [1-100] direction and the curving amount d2 in the [11-20] direction of a single crystal, and the BPD density contained in a crystal growth portion.

FIGS. 11A, 11B and 11C are diagrams showing the relationship of the BPD density contained in the crystal growth portion when the single crystal is crystal-grown on a predetermined SiC single crystal. FIG. 11A shows the relationship between the absolute value of the curving amount d1 of the atomic arrangement surface 2 on the cut surface cut along the [1-100] direction through the center in plan view and the BPD density contained in the crystal growth portion. The horizontal axis in FIG. 11A is the absolute value of the curving amount d1 of the atomic arrangement surface 2 on the cut surface cut along the [1-100] direction, and the vertical axis is the BPD density contained in the crystal growth portion. FIG. 11B shows the relationship between the absolute value of the curving amount d2 of the atomic arrangement surface 2 on the cut surface cut along the [11-20] direction through the center in plan view and the BPD density contained in the crystal growth portion. The horizontal axis in FIG. 11B is the absolute value of the curving amount d2 of the atomic arrangement surface 2 on the cut surface cut along the [11-20] direction, and the vertical axis is the BPD density contained in the crystal growth portion. FIG. 11C shows the relationship between the relative values of the curving amount d1 and the curving amount d2 and the density of BPD contained in the crystal growth portion. The horizontal axis in FIG. 11C is the relative values of the curving amount d1 and the curving amount d2, and the vertical axis is the BPD density contained in the crystal growth portion.

The SiC single crystal showing the relationship of the BPD density contained in the crystal growth portion in FIGS. 11A, 11B and 11C was produced by a sublimation method and had a diameter of 16 cm. A SiC single crystal was grown by about 20 mm on the seed crystal. The BPD density was determined using KOH etching.

As shown in FIGS. 11A and 11B, no correlation is confirmed between the curving amounts d1 and d2 and the BPD. Therefore, when a SiC single crystal having a small absolute value of the curvature curving d1 and d2 is used, the frequency of occurrence of BPD does not always decrease. That is, the absolute values of the curving amounts d1 and d2 do not sufficiently function as an index of the density of BPD.

On the other hand, as shown in FIG. 11C, there is a correlation between the relative values of the curving amount d1 and the curving amount d2 and the BPD. When the relative value of the curving amount d1 and the curving amount d2 becomes large, the frequency of occurrence of BPD tends to increase. In other words, the density of BPD can be reduced by using a SiC single crystal in which the difference between the curving amount d1 and the curving amount d2 is within a predetermined range.

Figure 12:
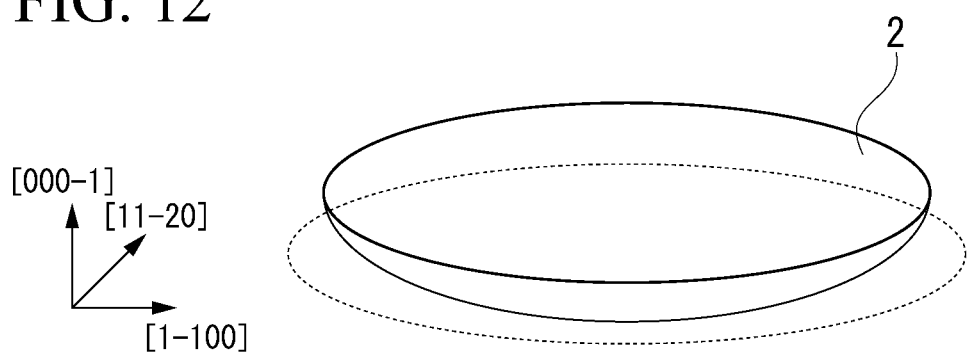
FIG. 12 is a schematic view of an example of the atomic arrangement surface of the SiC single crystal which concerns on this embodiment.

Here, the fact that the difference between the curving amount d1 and the curving amount d2 is small means that the shapes of the atomic arrangement surfaces 2 on the plurality of cut surfaces are similar. For example, as shown in FIG. 12, when both the atomic arrangement surface 2 on the cut surface cut along the [1-100] direction and the atomic arrangement surface 2 on the cut surface cut along the [11-20] direction are concave, both the curving amount d1 and the curving amount d2 are positive values. That is, for example, when the positive values $\alpha$ and $\beta$ are used and the curving amount d1 is a and the curving amount d2 is $\beta$, the difference between them is $\alpha$-$\beta$.

Figure 13:
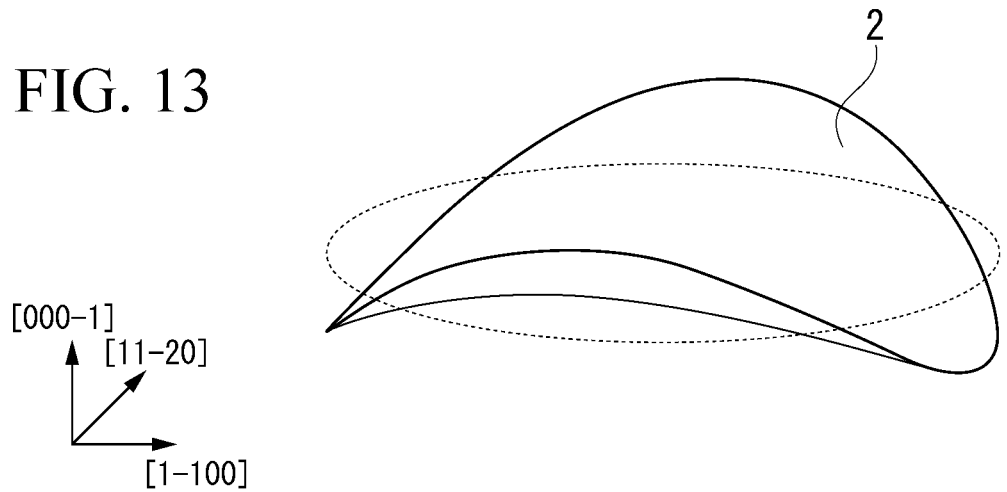
FIG. 13 is a schematic view of an example of the atomic arrangement surface of the SiC single crystal which the curving direction of the atomic arrangement surface is different depending on the direction.

On the other hand, for example, as shown in FIG. 13, when the atomic arrangement surface 2 on the cut surface cut along the [11-20] direction has a concave shape and the atomic arrangement surface 2 on the cut surface cut along the [1-100] direction has a convex shape, the curving amount d1 has a positive value, and the curving amount d2 has a negative value. Therefore, for example, when the positive values $\alpha$ and $\beta$ are used and the curving amount d1 is a and the curving amount d2 is $-\beta$, the difference between them is $\alpha+\beta$.

When the positive and negative of the curving amount d1 and the curving amount d2 are different, the difference between them becomes relatively large. Therefore, it is preferable that the curving amount d1 and the curving amount d2 have the same positive and negative values. That is, it is preferable that the atomic arrangement surface 2 on the cut surface cut along the [1-100] direction and the atomic arrangement surface 2 on the cut surface cut along the [11-20] direction may be curved in the same direction.

Further, in order to make the shape of the atomic arrangement surface 2 more similar, it is preferable to make the shape of the atomic arrangement surface 2 not only on cut surfaces in two directions but also on cut surfaces in three or more directions similar. The crystal structure of the SiC single crystal 1 is hexagonal. Therefore, if the relative value of the curving amount in the cut surface cut along the six directions symmetrical with respect to the center is within a predetermined value, the shape of the atomic arrangement surface 2 is more similar.

Specifically, the difference between the maximum value and the minimum value of the curving amount of the atomic arrangement surface 2 on each of the six cut surfaces cut along the six directions rotated by 30° with respect to the [1-100] direction through the center of the plan view is preferably 60 µm or less, more preferably 40 µm or less, and further preferably 20 µm or less. Further, the difference between the curving amounts of the atomic arrangement surface 2 on each of the cut surfaces cut along the 12 directions rotated by 15° with respect to the [1-100] direction through the center in plan view is more preferably within the range described above.

Further, the difference between the maximum value and the minimum value of the curving amount of the atomic arrangement surface 2 on an arbitrary cut surface is preferably 60 µm or less, more preferably 40 µm or less, and further preferably 20 µm or less.

Further, although the absolute value of the curving amount of the specific atomic arrangement surface 2 and the BPD density are not directly correlated as described above, from the viewpoint of reducing the relative value, it is preferable that the absolute value of the curving amount of the atomic arrangement surface 2 is also small. Specifically, the difference between the maximum value and the minimum value of the curving amount per unit length in the outer peripheral direction of the atomic arrangement surface 2 is preferably 4 µm/cm or less, more preferably 2 µm/cm or less, and further preferably 1 µm/cm or less. Here, the "the curving amount per unit length" means a value obtained by dividing the curving amount by the diameter of the SiC single crystal.

Further, the diameter of the SiC single crystal 1 in plan view is preferably 140 mm or more, and more preferably 150 mm or more.

As the size of the SiC single crystal 1 increases, the conditions for crystal growth differ between the center and the end in plan view, and the difficulty of growing a high-quality crystal increases. For example, compared to a 4-inch SiC single crystal, a 6-inch SiC single crystal is not only similar in shape and larger in shape, but also has a significantly higher degree of difficulty in crystal growth. In other words, as the size of the SiC single crystal 1 in plan view becomes larger, it is required to start crystal growth from a state in which BPD is less likely to occur. That is, the larger the diameter of the SiC single crystal 1 in plan view is, the higher the value of suppressing BPD by satisfying a predetermined condition is.

The thickness of the SiC single crystal 1 is preferably 500 nm or more, more preferably 750 nm or more, and further preferably 1 mm or more. When the thickness of the SiC single crystal 1 is 500 nm or more, the warp of the SiC single crystal 1 itself can be suppressed. The term "warp" here means the degree of deformation of the wafer. The flatter the wafer is, the smaller the warp is, and the more the wafer is curved in the crystal growth direction, for example, the larger the warp is. If the SiC single crystal 1 itself is warped, it becomes difficult to accurately estimate the curving amount of the atomic arrangement surface 2. The warpage amount of the SiC single crystal 1 is preferably 5 µm or less in any direction, and more preferably 3 nm or less. Here, the warpage amount of the SiC single crystal 1 means that when the SiC single crystal 1 is mounted on an external flat surface, the maximum value of the distance of the perpendicular line drawn from the mounting surface, which is the surface on the flat surface side of the surface of the SiC single crystal 1, toward the flat surface. That is, a predetermined surface of the SiC single crystal 1 is used as a mounting surface, and an external flat surface is used as a flat surface. When the SiC single crystal 1 is placed so that the mounting surface is in contact with the flat surface, the maximum value of the distance between the mounting surface and the flat surface is called the warpage amount.

As described above, when crystal growth is carried out using the SiC single crystal according to the present embodiment, the occurrence of basal plane dislocations (BPD) can be suppressed in the crystal growth portion.

(Manufacturing Method of SiC Single Crystal, SiC Ingot and SiC Wafer)

The sublimation method is known as one of the methods for producing a SiC single crystal. The sublimation method is a method of recrystallizing a raw material gas generated by heating a raw material on a single crystal (seed crystal) to obtain a large single crystal (ingot). Hereinafter, the recrystallized SiC single crystal may be referred to as a SiC ingot in the present specification.

Figure 14:
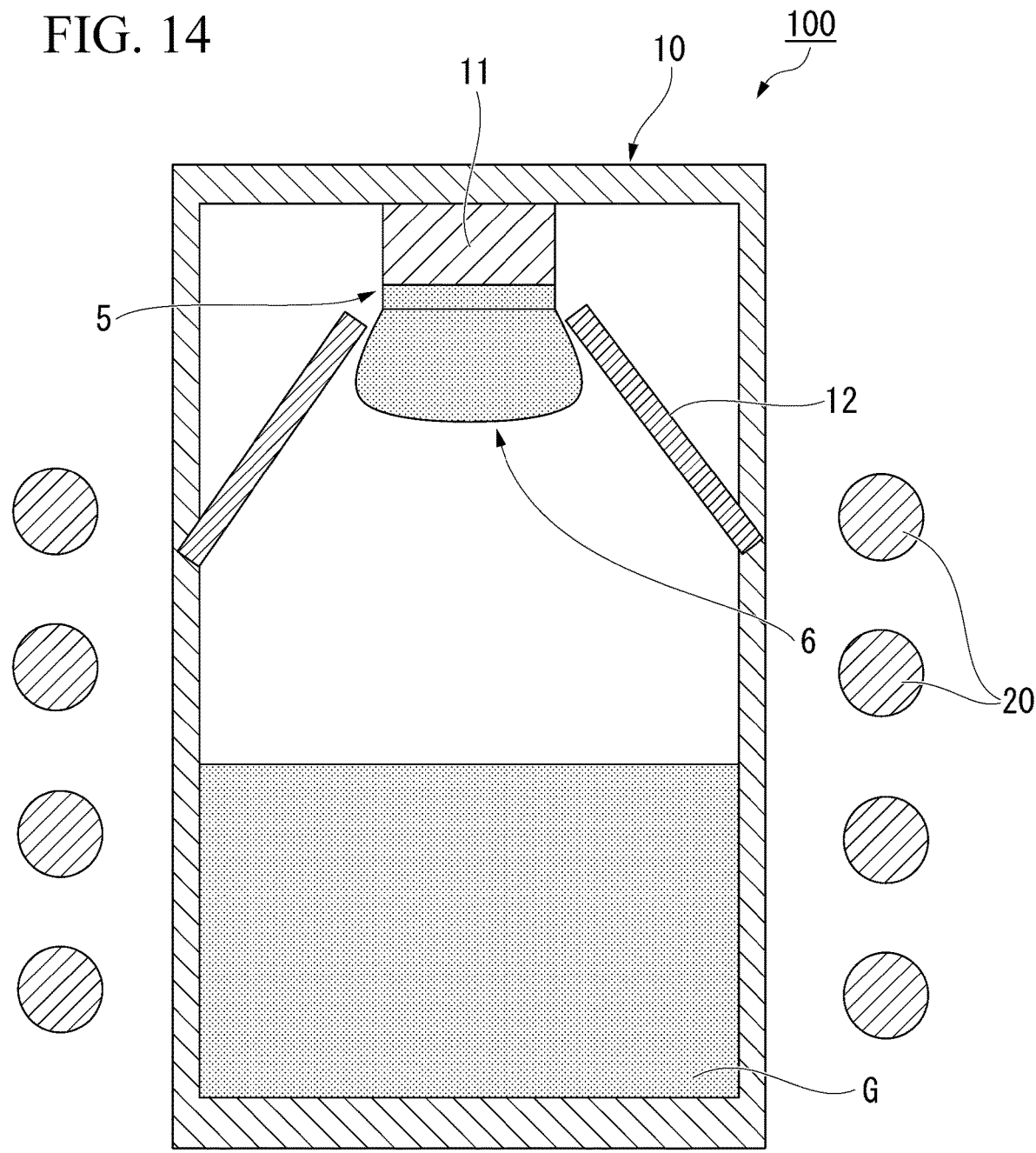
FIG. 14 is a schematic diagram of an example of the manufacturing apparatus used in the sublimation method.

FIG. 14 is a schematic cross-sectional view schematically showing a cross section of an example of a manufacturing apparatus used in the sublimation method. The manufacturing apparatus 100 has a crucible 10 and a coil 20. A heating element (not shown) that generates heat due to the induction heating of the coil 20 may be provided between the crucible 10 and the coil 20. The method for manufacturing the SiC single crystal, the SiC ingot, and the SiC wafer according to the present embodiment is not limited to the manufacturing apparatus shown in FIG. 14, and any manufacturing apparatus can be used.

The crucible 10 has a crystal installation portion 11 provided at a position facing the raw material G The crucible 10 may have a taper guide 12 inside which the diameter is increased from the crystal installation portion 11 toward the raw material G In FIG. 14, the raw material G, the seed crystal 5, and the SiC ingot 6 grown from the seed crystal 5 are simultaneously illustrated for ease of understanding.

When an alternating current is applied to the coil 20, the crucible 10 is heated and a raw material gas is generated from the raw material G. The generated raw material gas is supplied to the seed crystal 5 installed in the crystal installation member 11 along the taper ride 12. By supplying the raw material gas to the seed, crystal 5, the SiC ingot 6 crystal grows on the main surface of the seed crystal 5. The crystal growth plane of the 5 seed crystal 5 is a carbon plane (C plan-) or a plane provided with an off angle of 0 to 10° from the carbon plane. The crystal growth surface of the seed crystal 5 is more preferably a carbon surface or a surface provided with an off angle of 0 to 5° from the carbon surface.

The seed crystal 5 corresponds to the SiC single crystal 1 according to the present embodiment. The seed crystal 5 is used by cutting out a part of the already prepared SiC ingot. Therefore, as the seed crystal 5, it is possible to select a seed crystal 5 that meets a predetermined condition from the already produced SiC ingots.

Therefore, as a seed crystal 5, a SiC single crystal cut out from a SiC ingot having the difference between the curving amount of the atomic arrangement surface on the cut surface cut along the [1-100] direction through the center in plan view and the curving amount of the atomic arrangement surface on the cut surface cut along the [11-20] direction through the center in plan view of 60 µm or less is used.

The SiC ingot 6 that grows from the seed crystal 5 inherits much of the crystal information of the seed crystal 5. Therefore, by selecting the seed crystal 5 having a small lattice curving anisotropy, the anisotropy of the lattice curving of the SiC ingot 6 crystal grown from the seed crystal 5 can be suppressed to be small.

In order to reduce the curving amount of the atomic arrangement plane of the SiC single crystal grown on the seed crystal 5 to 60 µm or less, seed crystal 5 having the curving amount of an atomic arrangement plane of 60 μm or less can be selected, a seed crystal having the curving amount of 40 μm or less is preferably selected, and a seed crystal having the curving amount of 20 μm or less is more preferable. When a seed crystal in which the curving amount of the atomic arrangement surface is smaller than 60 μm by a certain amount or more is used, a SiC single crystal having the curving amount of 60 μm or less can be obtained more reliably.

Further, it is preferable to use a seed prepared by the RAF method (repeated a-face method), as the seed crystal 5. The RAF method is a method in which c-plane growth is performed after a-plane growth is performed at least once. When the RAF method is used, a SiC single crystal having few screw dislocations, stacking faults and BPD can be produced. This is because the screw dislocations, stacking faults, and BPD of the SiC single crystal after the a-plane growth are not inherited by the SiC single crystal after the c-plane growth.

The thickness of the seed crystal 5 is preferably 1 mm or more, more preferably 2 mm or more, and further preferably 3 mm or more. If the seed crystal 5 is thick, it is possible to avoid bending the seed crystal 5 itself. When the seed crystal 5 is curved, the SiC ingot 6 that grows on the seed crystal 5 is affected by the curving of the seed crystal itself and the curving of the atomic arrangement surface 2 in the seed crystal 5. That is, even if the atomic arrangement surface 2 of the seed crystal 5 has a predetermined curved surface, the curved surface may not be inherited by the SiC ingot 6.

Next, the prepared seed crystal 5 is fixed to the crystal installation portion 11 with an adhesive or the like. As the adhesive, it is preferable to use an adhesive having less anisotropy in the surface shape of the adhesive, and it is preferable to use an adhesive that does not deform the seed crystal 5 in a specific direction before and after attachment. When the adhesive has anisotropy, stress may be applied to the inside of the grown SiC ingot 6 due to the influence of the anisotropy of the adhesive during cooling after crystal growth, and the atomic arrangement surface may be deformed.

Then, the crucible 10 is heated to sublimate the raw material G When sublimating the raw material G, it is preferable to rotate the crystal installation portion 11 in the circumferential direction relative to the raw material G so that the SiC ingot 6 does not have anisotropy in the circumferential direction. The rotation speed is preferably 0.1 rpm or more, more preferably 0.3 rpm or more, and further more preferably 0.5 rpm or more. Further, it is preferable to reduce the temperature change on the growth surface during crystal growth. By reducing the temperature change of the growth surface, the shape of the atomic arrangement surface 2 of the seed crystal 5 is inherited by the SiC ingot 6.

As described above, since the atomic arrangement surface 2 of the seed crystal 5 satisfies a predetermined condition, the generation of BPD in the SiC ingot 6 is suppressed. Therefore, a high-quality SiC ingot 6 having a low BPD density can be obtained. Further, since the atomic arrangement surface 2 of the obtained SiC ingot 6 also satisfies a predetermined condition, a part thereof can be cut out and used again as a seed crystal 5.

Finally, the obtained SiC ingot 6 is sliced to prepare a SiC wafer. The cutting direction is perpendicular to <0001> or in a direction with an off angle of 0 to 10°, and a wafer having a surface parallel to the C surface or an off angle of 0 to 10° from the C surface is produced. The surface of the wafer may be mirror-processed on the (0001) surface side, that is, the Si surface side. The Si surface is a surface that is usually epitaxially grown. Since the SiC ingot 6 has few BPD, a SiC wafer having few BPD can be obtained. By using a SiC wafer having few BPD, which is a killer defect, a high-quality SiC epitaxial wafer can be obtained, and the yield of the SiC device can be increased.

The preferred embodiment of the present invention has been described in detail above. The present invention is not limited to a specific embodiment, and can be modified and modified in various ways within the scope of the gist of the present invention described in the claims.

EXAMPLES

Experimental Example 1

In Experimental Example 1, a seed crystal composed of a 4H-SiC single crystal, in which both atomic arrangement surface in the cut plane cut along the <1-100> direction (specifically, the [1-100] direction) and atomic arrangement surface in the cut plane cut along the <11-20> direction (specifically, the [11-20] direction) orthogonal to the <1-100> are curved in the same direction, is prepared. The diameter of the seed crystal was 16 cm.

Figure 15:
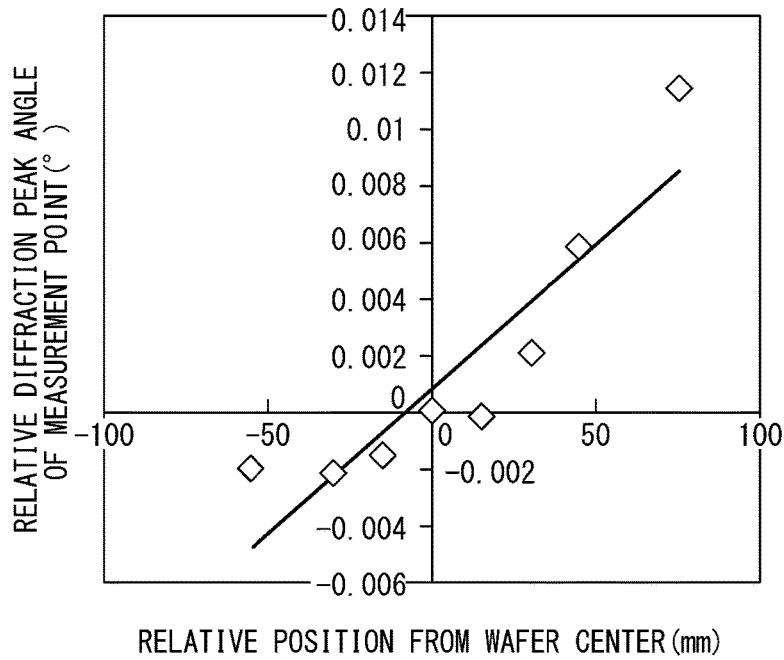
FIG. 15 is a figure for obtaining the radius of curvature of the atomic arrangement plane from a plurality of XRD measurement points in the SiC seed crystal which concerns on Experimental Example 1.
Figure 15:
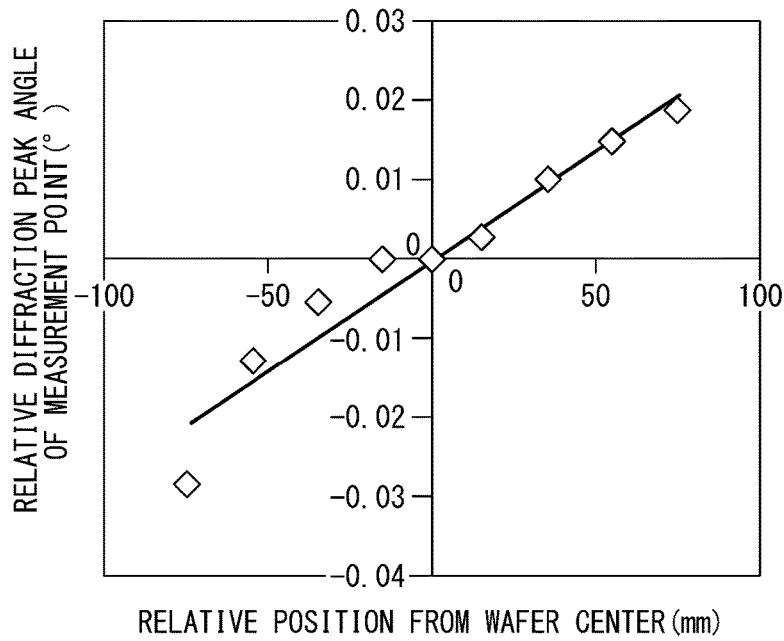

For this seed crystal, the radius of curvature of the atomic arrangement surface was determined from a plurality of XRD measurement points. The measurement results in the [1-100] direction and the [11-20] direction of the X-ray diffraction measurement are shown in FIG. 15, respectively. In the figure, the measurement results at the XRD measurement points are plotted. In FIG. 15, the horizontal axis shows the relative position of the seed crystal from the center in plan view, and the vertical axis shows the relative diffraction peak angle of each measurement point with respect to the central diffraction peak angle of the seed crystal. The atomic arrangement surface was measured by the method described in the above (a specific description of the method for measuring the curving amount of the atomic arrangement surface). From the X-ray diffraction measurement results, it was calculated that the concave surface had a radius of curvature of 205 m and the curving amount of 13.7 μm in the [1-100] direction, and the concave surface had a radius of curvature of 556 m and the curving amount of 5.1 μm in the [11-20] direction. That is, the curving amount was a positive value in all directions, and the atomic arrangement surface 2 had a concave shape recessed toward the center in plan view. The difference in the curving amount of the atomic arrangement surface 2 in the two measurement directions was 8.6 μm.

This seed crystal was placed at a position facing the raw material so that the atomic arrangement surface had a concave shape with respect to the laminated surface. Then, the crucible was heated to sublimate the raw material, and a SiC single crystal was grown by about 20 mm on the laminated surface of the seed crystal to obtain a SiC ingot.

When a wafer was prepared from a SiC ingot and the BPD density was determined by KOH etching, the BPD density was 350 pieces/cm$^2$. Regarding the wafer produced from the obtained SiC ingot, the shapes and the curving amounts of the [1-100] direction atomic arrangement surface and the [11-20] direction atomic arrangement surface were confirmed by X-ray diffraction (XRD) by the same method as that of the SiC seed crystal.

Figure 16:
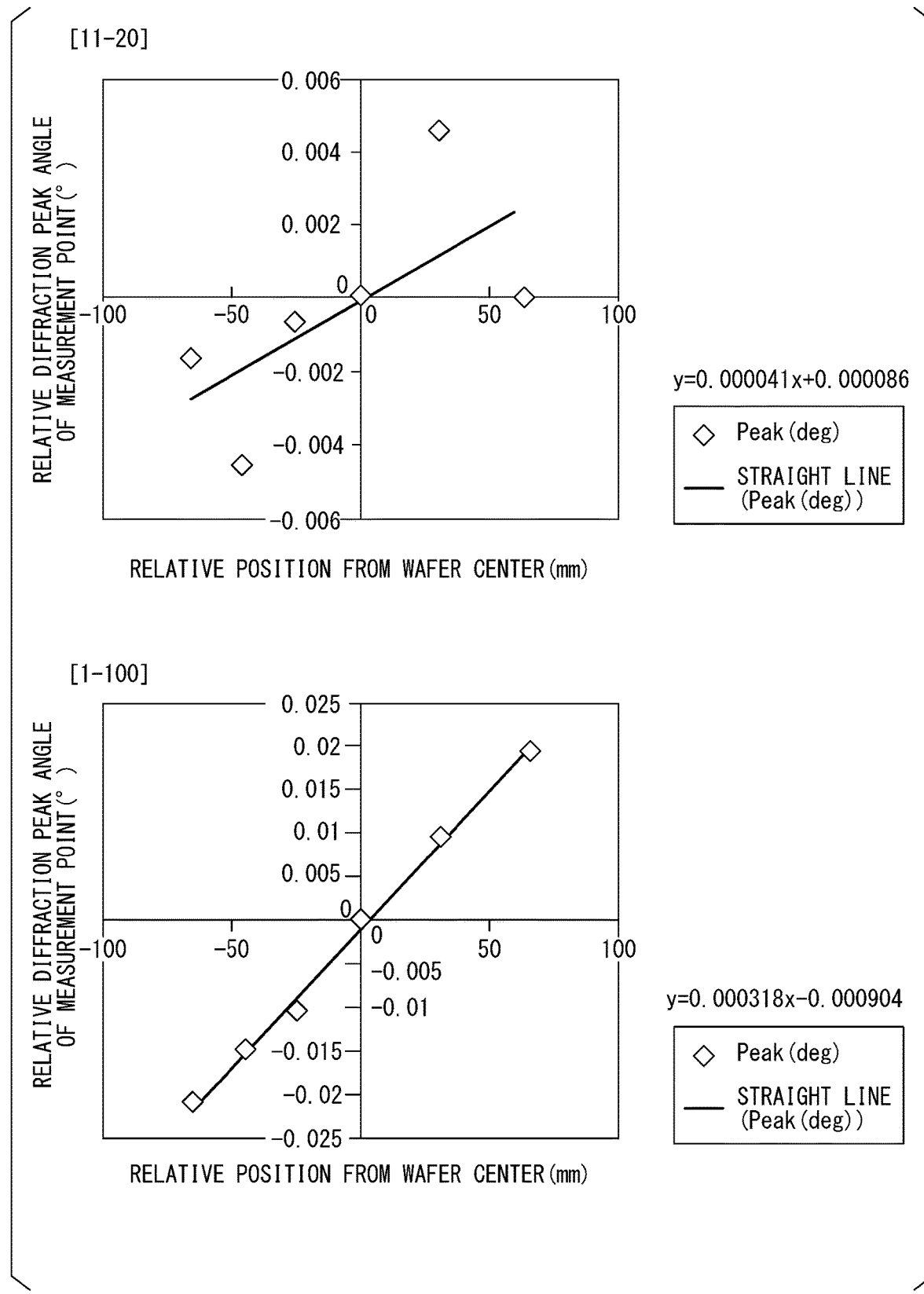
FIG. 16 is a figure for obtaining the radius of curvature of the atomic arrangement plane from a plurality of XRD measurement points in the SiC single crystal after the growth which concerns on Experimental Example 1.

For this wafer, the radius of curvature of the atomic arrangement surface was determined from a plurality of XRD measurement points. The measurement results in the [1-100] direction and the [11-20] direction of the X-ray diffraction measurement are shown in FIG. 16. In the figure, the measurement results at the XRD measurement points are plotted. As shown in FIG. 16, the obtained wafers (SiC ingots) were all curved in the same direction as in the seed crystal. It was calculated that the concave surface had a radius of curvature of 180 m and the curving amount of 15.6 µm in the [1-100] direction, and the concave surface had a radius of curvature of 1380 m and the curving amount of 2.0 µm in the [11-20] direction. That is, the curving amount was a positive value in all directions, and the atomic arrangement surface 2 had a concave shape recessed toward the center in plan view. The difference in the amount of curvature of the atomic arrangement surface 2 in the two measurement directions was 13.6 µm.

As mentioned above, by using a concave seed crystal whose atomic arrangement surface is recessed toward the center in plan view, a concave SiC ingot and wafer whose atomic arrangement surface is recessed toward the center in plan view are produced.

Figure 19:
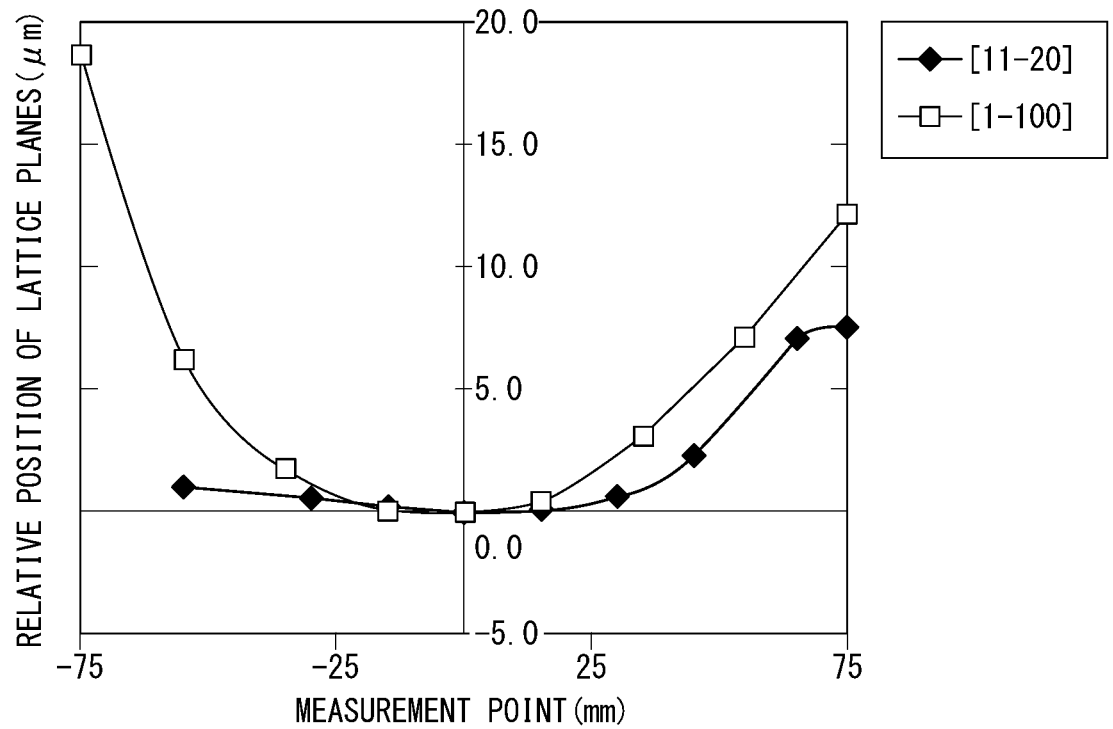
FIG. 19 is a figure which shows the measured value of the relative position of the lattice plane of the SiC seed crystal which concerns on Experimental Example 1.
Figure 20:
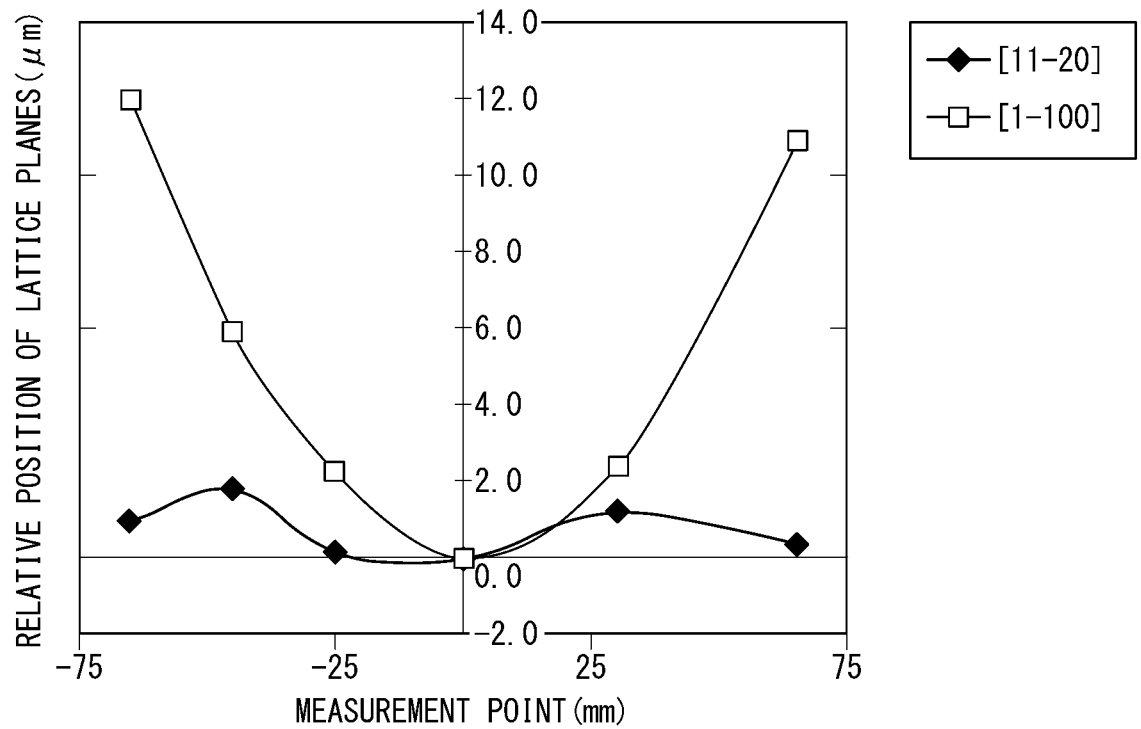
FIG. 20 is a figure which shows the measured value of the relative position of the lattice plane of the SiC single crystal after the growth which concerns on Experimental Example 1.

In addition, the atomic arrangement surface of the crystal of Experimental Example 1 was measured using another measuring method. This other method is the method described in the above (the explanation of another method for measuring the curving amount of the atomic arrangement surface). Using this method, the shapes of the [1-100] direction atomic arrangement surface and the [11-20] direction atomic arrangement surface are measured for the same seed crystal as in Experimental Example 1 and the wafer (SiC ingot) obtained from the seed crystal. The results are shown in FIGS. 19 and 20, respectively. In the figure, the relative positions of the lattice planes at the measurement positions are plotted. It was confirmed that all of the obtained SiC ingots were curved in the same direction as in the seed crystal, and the difference in the amount of curvature was 60 nm or less.

Experimental Example 2

In Experimental Example 2, a seed crystal composed of a 4H-SiC single crystal, in which both atomic arrangement surface in the cut plane cut along the <1-100> direction (specifically, the [1-100] direction) and atomic arrangement surface in the cut plane cut along the <11-20> direction (specifically, the [11-20] direction) orthogonal to the <1-100> are curved in different directions, is prepared. The diameter of the seed crystal was 16 cm.

Figure 17:
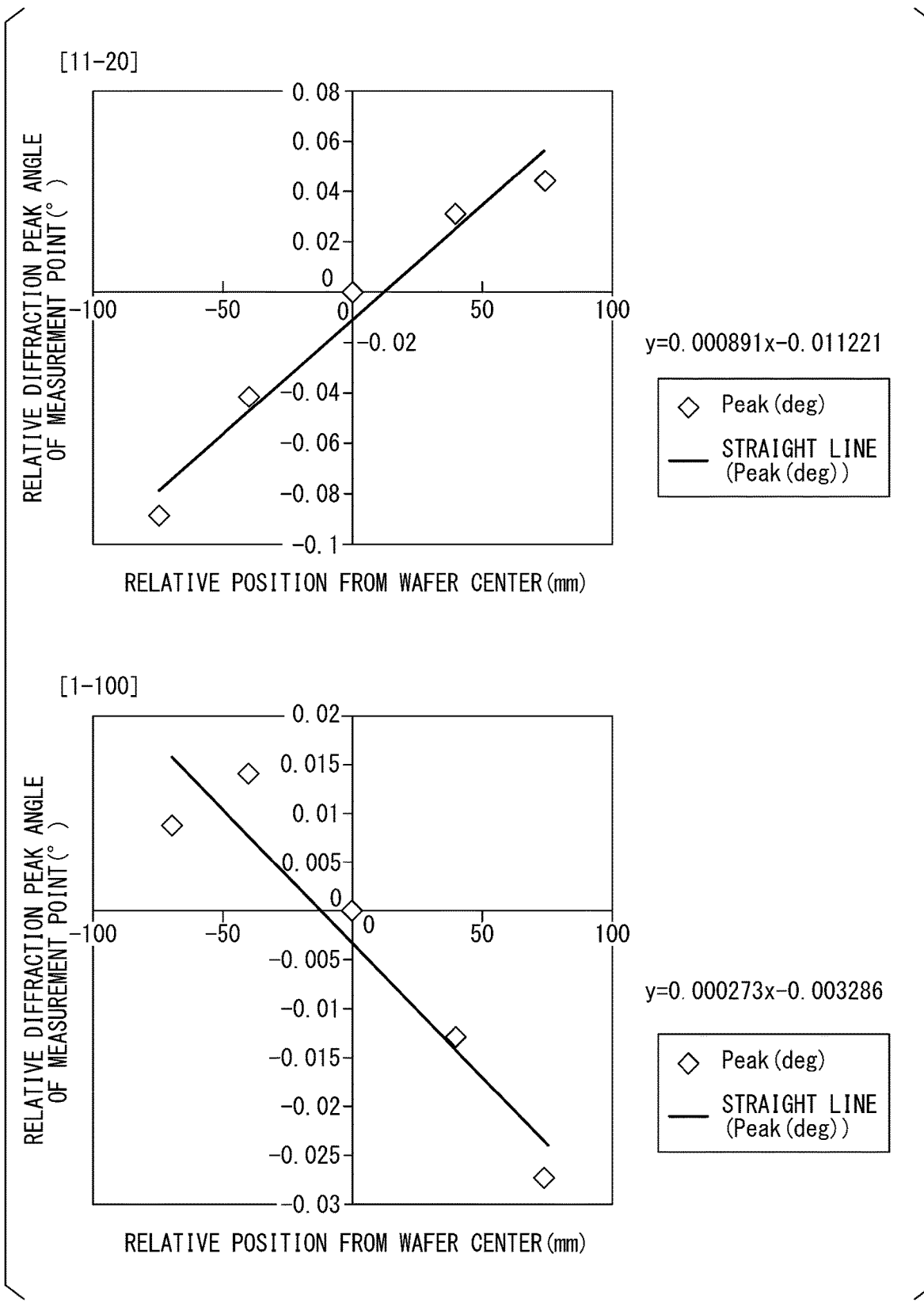
FIG. 17 is a figure for obtaining the radius of curvature of the atomic arrangement plane from a plurality of XRD measurement points in the SiC seed crystal which concerns on Experimental Example 2.

For this seed crystal, the radius of curvature of the atomic arrangement surface was determined from a plurality of XRD measurement points. The measurement results in the [1-100] direction and the [11-20] direction of the X-ray diffraction measurement are shown in FIG. 17, respectively. In the figure, the measurement results at the XRD measurement points are plotted. The atomic arrangement surface was measured by the method described in the above (Specific description of the method for measuring the curving mount of the atomic arrangement surface). From the X-ray diffraction measurement results, it was calculated that the convex surface had a radius of curvature of −150 m and the curving amount of −18.8 nm in the [1-100] direction, and the concave surface had a radius of curvature of 64 m and the curving amount of 43.9 µm in the [11-20] direction. That is, the curving amount is different from negative in the [1-100] direction and positive in the [11-20] direction. The atomic arrangement surface 2 had a convex shape on one cut surface and a concave potato chips type (saddle shape) on the different cut surfaces. The difference in the curving mount of the atomic arrangement surface 2 in the two measurement directions was 62.7 µm.

Then, in the same manner as in Experimental Example 1, a SiC single crystal was grown by about 20 mm on the laminated surface of the seed crystal of Experimental Example 2 to obtain a SiC ingot.

Figure 18:
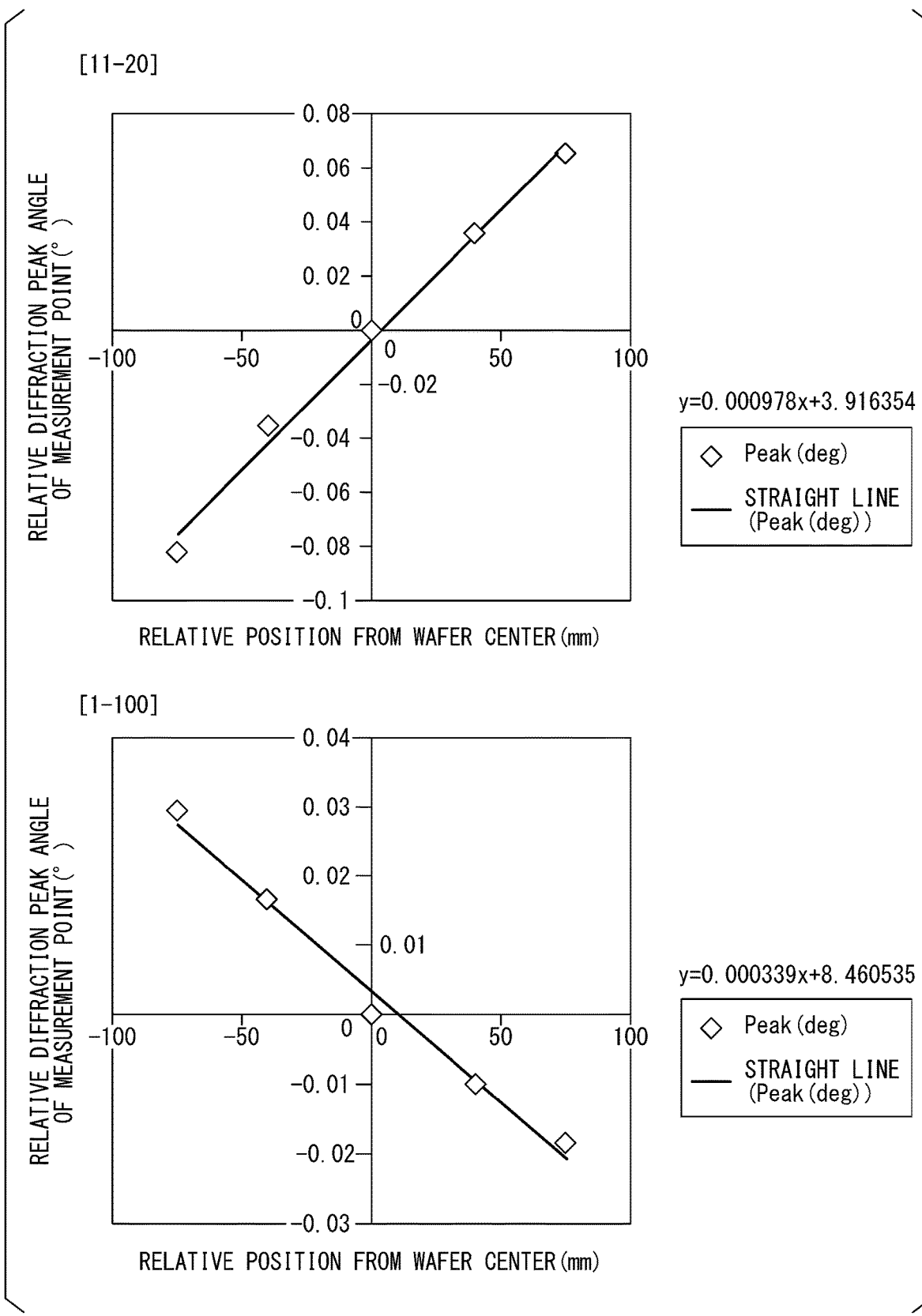
FIG. 18 is a figure for obtaining the radius of curvature of the atomic arrangement plane from a plurality of XRD measurement points in the SiC single crystal after the growth which concerns on Experimental Example 2.

The BPD density in the obtained SiC ingot was as high as 6020 pieces/cm². Regarding the wafer produced from the obtained SiC ingot, the shapes of the [1-100] direction atomic arrangement surface and the [11-20] direction atomic arrangement surface were confirmed by X-ray diffraction (XRD) by the same method as that of the SiC seed crystal. For this wafer, the radius of curvature of the atomic arrangement surface was determined from a plurality of XRD measurement points. The measurement results in the [1-100] direction and the [11-20] direction of the X-ray diffraction measurement are shown in FIG. 18. In the figure, the measurement results at the XRD measurement points are plotted. From the X-ray diffraction measurement results, it was calculated that the convex surface had a radius of curvature of −169 m and the curving amount of −16.6 µm in the [1-100] direction, and the concave surface had a radius of curvature of 59 m and the curving amount of 47.7 µm in the [11-20] direction. That is, the curving amount is different from negative in the [1-100] direction and positive in the [11-20] direction. The atomic arrangement surface 2 had a convex shape on one cut surface and a concave potato chips type (saddle shape) on the different cut surfaces. The difference in the curving amount of the atomic arrangement surface 2 in the two measurement directions was 64.3 µm.

Figure 21:
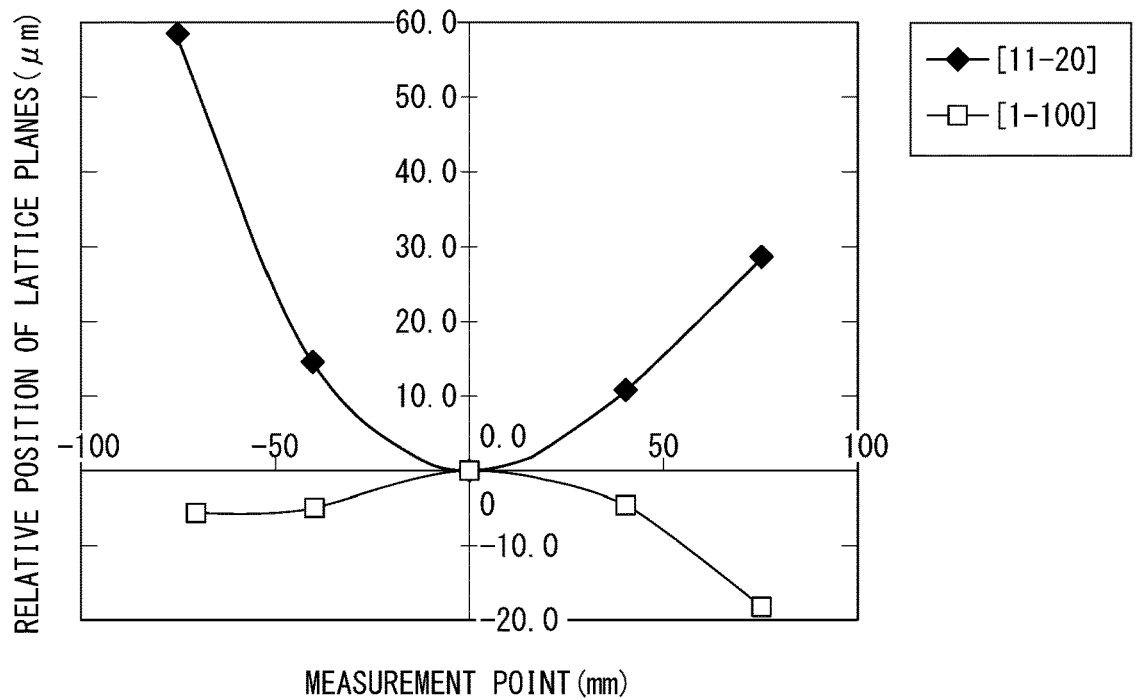
FIG. 21 is a figure which shows the measured value of the relative position of the lattice plane of the SiC seed crystal which concerns on Experimental Example 2.
Figure 22:
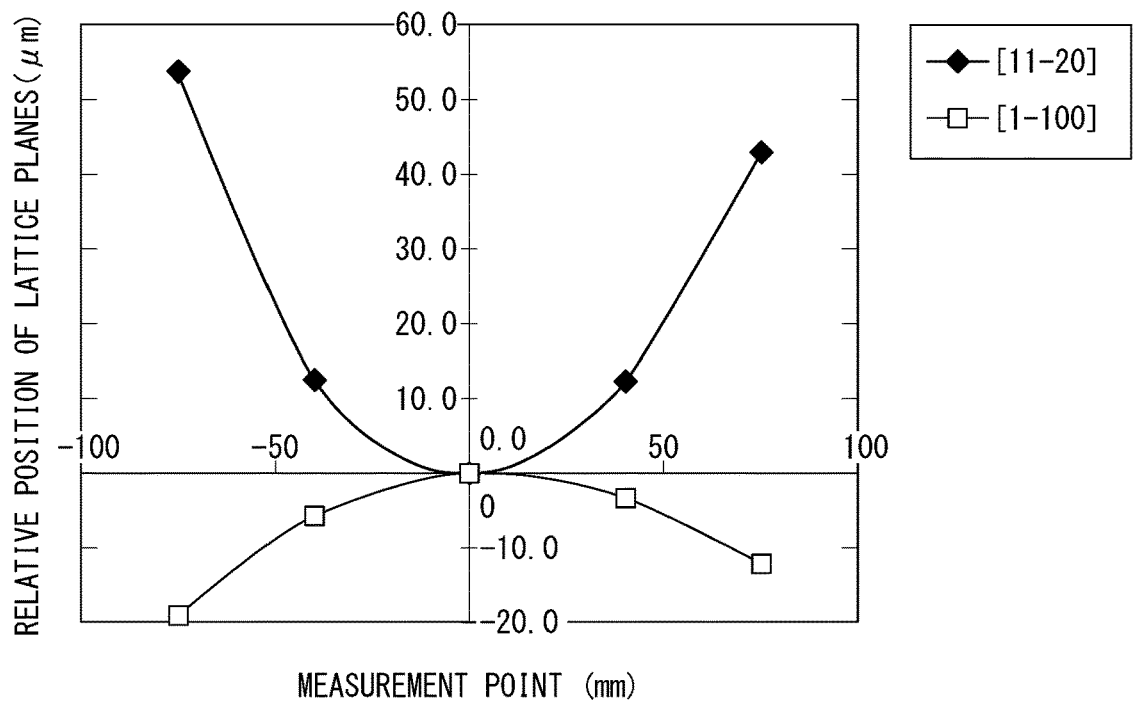
FIG. 22 is a figure which shows the measured value of the relative position of the lattice plane of the SiC single crystal after the growth which concerns on Experimental Example 2.

Further, for the crystal of Experimental Example 2, using the same method as described in Experimental Example 1 (Explanation of another method for measuring the curving amount of the atomic arrangement surface), the shapes of the [1-100] direction atomic arrangement surface and the [11-20] direction atomic arrangement surface are measured for the same seed crystal as in Experimental Example 2 and the wafer (SiC ingot) obtained from the seed crystal. The results are shown in FIGS. 21 and 22, respectively. In the figure, the relative positions of the lattice planes at the measurement positions are plotted. It was confirmed that the shapes of the [1-100] atomic arrangement surface and the [11-20] atomic arrangement surface of the obtained wafer and the SiC ingot were curved in different directions as in the seed crystal.

As described above, in Experimental Example 2, a potato chips type (saddle type) seed crystal having a convex shape on one cut surface and a concave shape on a different cut surface was used. Therefore, the shape of the atomic arrangement surface in the obtained SiC ingot was also potato chips type (saddle type), and the difference in the curving amount of the atomic arrangement surface 2 in the two measurement directions was not less than 60 µm. The BPD density in the obtained SiC ingot was as high as 6020 pieces/cm².

Here, the results of Experimental Example 1 and Experimental Example 2 do not indicate that the BPD density is good as a SiC single crystal and the BPD density is poor as a SiC single crystal. The BPD density observed in a SiC single crystal depends on the desired level. That is, the results of Experimental Example 1 and Experimental Example 2 indicates that there is a correlation between the relative value of the warp of the lattice plane and the BPD density.

EXPLANATION OF REFERENCES

1 SiC single crystal
2 Atomic arrangement surface
5 Seed crystal

6 SiC ingot
10 Crucible
11 Crystal installation member
12 Taper guide
20 Coil
100 Manufacturing apparatus
A Atom
G Raw material

What is claimed is:

1. A SiC single crystal, wherein the difference between the curving amount of the atomic arrangement surface on the cut surface cut along the <1-100> direction through the center in plan view and the curving amount of the atomic arrangement surface on the cut surface cut along the <11-20> direction that passes through the center of view and is perpendicular to the <1-100> direction is 60 μm or less.

2. The SiC single crystal according to claim 1, wherein the difference between the maximum value and the minimum value of the curing amount of the atomic arrangement surface on each of the cut surfaces cut along the six sides rotated by 30° with respect to the [1-100] direction through the center in plan view is 60 μm or less.

3. The SiC single crystal according to claim 1, wherein the atomic arrangement surfaces are curved in the same direction at any cut surface.

4. The SiC single crystal according to claim 1, wherein the difference between the maximum value and the minimum value of the curving amount per unit length on the atomic arrangement surface is 4 μm/cm or less.

5. The SiC single crystal according to claim 1, wherein the diameter of the SiC single crystal in plan view is 140 mm or more.

6. The SiC single crystal according to claim 1, wherein the thickness of the SiC single crystal is 500 μm or more.

7. A method of manufacturing a SiC ingot, wherein the SiC single crystal according to claim 1 is used as a seed crystal, and a SiC single crystal is formed on C-plane ((000-1) plane) or a plane having an off angle of 0 to 10° from the C-plane of the seed crystal.

8. A method of manufacturing a SiC wafer, wherein a SiC ingot produced by the method for producing the SiC ingot according to claim 7, is sliced.

* * * * *